(12) United States Patent
Ishikawa et al.

(10) Patent No.: US 12,060,651 B2
(45) Date of Patent: Aug. 13, 2024

(54) CHAMBER ARCHITECTURE FOR EPITAXIAL DEPOSITION AND ADVANCED EPITAXIAL FILM APPLICATIONS

(71) Applicant: Applied Materials, Inc., Santa Clara, CA (US)

(72) Inventors: Tetsuya Ishikawa, San Jose, CA (US);
Swaminathan T. Srinivasan, Pleasanton, CA (US); Kartik Bhupendra Shah, Saratoga, CA (US);
Ala Moradian, Sunnyvale, CA (US);
Manjunath Subbanna, Bangalore (IN);
Matthias Bauer, Sunnyvale, CA (US);
Peter Reimer, Los Altos, CA (US);
Michael R. Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 175 days.

(21) Appl. No.: 17/317,363

(22) Filed: May 11, 2021

(65) Prior Publication Data
US 2022/0364261 A1 Nov. 17, 2022

(51) Int. Cl.
*C30B 25/14* (2006.01)
*C23C 16/44* (2006.01)
(Continued)

(52) U.S. Cl.
CPC .......... *C30B 25/14* (2013.01); *C23C 16/4412* (2013.01); *C23C 16/455* (2013.01);
(Continued)

(58) Field of Classification Search
CPC ......... C30B 25/02; C30B 25/08; C30B 25/10; C30B 25/105; C30B 25/12; C30B 25/14;
(Continued)

(56) References Cited

U.S. PATENT DOCUMENTS

| 4,687,542 A | * | 8/1987 | Davis | ................ | H01L 21/67748 |
| | | | | | 156/345.31 |
| 5,446,825 A | * | 8/1995 | Moslehi | ................ | C23C 16/481 |
| | | | | | 118/724 |

(Continued)

FOREIGN PATENT DOCUMENTS

CN 103088415 A 5/2013

OTHER PUBLICATIONS

International Search Report and Written Opinion for International Application No. PCT/US2022/025540 dated Aug. 4, 2022.

(Continued)

*Primary Examiner* — Kurt Sweely
(74) *Attorney, Agent, or Firm* — Patterson + Sheridan, LLP

(57) ABSTRACT

The present disclosure generally relates to a process chamber for processing of semiconductor substrates. The process chamber includes an upper lamp assembly, a lower lamp assembly, a substrate support, an upper window disposed between the substrate support and the upper lamp assembly, a lower window disposed between the lower lamp assembly and the substrate support, an inject ring, and a base ring. Each of the upper lamp assembly and the lower lamp assembly include vertically oriented lamp apertures for the placement of heating lamps therein. The inject ring includes gas injectors disposed therethrough and the base ring includes a substrate transfer passage, a lower chamber exhaust passage, and one or more upper chamber exhaust passages. The gas injectors are disposed over the substrate transfer passage and across from the lower chamber exhaust passage and the one or more upper chamber exhaust passages.

20 Claims, 13 Drawing Sheets

(51) Int. Cl.
| | |
|---|---|
| *C23C 16/455* | (2006.01) |
| *C23C 16/458* | (2006.01) |
| *C23C 16/46* | (2006.01) |
| *C23C 16/48* | (2006.01) |
| *C30B 25/08* | (2006.01) |
| *C30B 25/10* | (2006.01) |
| *C30B 25/12* | (2006.01) |
| *H01L 21/67* | (2006.01) |
| *H01L 21/677* | (2006.01) |

(52) U.S. Cl.
CPC .... *C23C 16/45504* (2013.01); *C23C 16/4558* (2013.01); *C23C 16/46* (2013.01); *C30B 25/08* (2013.01); *C30B 25/10* (2013.01); *C30B 25/12* (2013.01); *H01L 21/67115* (2013.01); *H01L 21/67742* (2013.01); *C23C 16/4411* (2013.01); *C23C 16/4584* (2013.01); *C23C 16/482* (2013.01); *H01L 21/67748* (2013.01)

(58) Field of Classification Search
CPC . C30B 25/16; C30B 25/165; H01L 21/67115; H01L 21/6719; H01L 21/67248; H01L 21/67739; H01L 21/67742; H01L 21/67748; H01L 21/68714; H01L 21/68742; H01L 21/6875; H01L 21/68764; H01L 21/68785; H01L 21/68792; H01L 21/67098; C23C 16/4411; C23C 16/4412; C23C 16/45504; C23C 16/45508; C23C 16/45517; C23C 16/45561; C23C 16/45563; C23C 16/45568; C23C 16/45578; C23C 16/4558; C23C 16/45587; C23C 16/45591; C23C 16/4583; C23C 16/4584; C23C 16/4585; C23C 16/4586; C23C 16/46; C23C 16/481; C23C 16/482; C23C 16/455; C23C 16/45572
See application file for complete search history.

(56) References Cited

U.S. PATENT DOCUMENTS

| | | | | |
|---|---|---|---|---|
| 5,881,208 | A * | 3/1999 | Geyling | H01L 21/67103 |
| | | | | 392/418 |
| 5,970,214 | A * | 10/1999 | Gat | C30B 31/12 |
| | | | | 392/416 |
| 5,980,194 | A * | 11/1999 | Freerks | H01L 21/68 |
| | | | | 414/754 |
| 6,072,160 | A * | 6/2000 | Bahl | C30B 31/12 |
| | | | | 392/416 |
| 6,098,637 | A * | 8/2000 | Parke | C23C 16/4405 |
| | | | | 118/724 |
| 6,301,434 | B1 | 10/2001 | McDiarmid et al. | |
| 6,902,622 | B2 * | 6/2005 | Johnsgard | C23C 16/46 |
| | | | | 118/724 |
| 8,183,132 | B2 | 5/2012 | Nijhawan et al. | |
| 8,317,449 | B2 * | 11/2012 | Newman | H01L 21/68771 |
| | | | | 414/217 |
| 8,491,720 | B2 | 7/2013 | Ishikawa et al. | |
| 8,568,529 | B2 | 10/2013 | Ishikawa et al. | |
| 8,852,349 | B2 * | 10/2014 | Chacin | C23C 16/45521 |
| | | | | 118/728 |
| 8,980,005 | B2 * | 3/2015 | Carlson | C23C 16/45578 |
| | | | | 118/715 |
| 9,466,515 | B2 * | 10/2016 | Kobayashi | H01L 21/67109 |
| 9,929,027 | B2 | 3/2018 | Ranish et al. | |
| 10,145,011 | B2 | 12/2018 | Abedijaberi et al. | |
| 10,202,707 | B2 | 2/2019 | Ranish et al. | |
| 2003/0219981 | A1 | 11/2003 | Ammon et al. | |
| 2005/0103261 | A1 | 5/2005 | Von Ammon et al. | |
| 2006/0219362 | A1 | 10/2006 | Han et al. | |
| 2007/0087533 | A1 * | 4/2007 | Nishikawa | C23C 16/4409 |
| | | | | 438/478 |
| 2008/0017116 | A1 | 1/2008 | Campbell et al. | |
| 2009/0092469 | A1 * | 4/2009 | Sekimoto | H01L 21/68728 |
| | | | | 204/194 |
| 2010/0083898 | A1 * | 4/2010 | Kogura | C23C 16/45546 |
| | | | | 118/692 |
| 2010/0092697 | A1 | 4/2010 | Poppe et al. | |
| 2010/0092698 | A1 | 4/2010 | Poppe et al. | |
| 2010/0215872 | A1 | 8/2010 | Sivaramakrishnan et al. | |
| 2010/0258049 | A1 | 10/2010 | Ishikawa et al. | |
| 2010/0258052 | A1 | 10/2010 | Ishikawa et al. | |
| 2010/0261340 | A1 | 10/2010 | Nijhawan et al. | |
| 2010/0263587 | A1 | 10/2010 | Sivaramakrishnan et al. | |
| 2012/0088356 | A1 | 4/2012 | Santhanam et al. | |
| 2014/0137801 | A1 * | 5/2014 | Lau | C30B 25/14 |
| | | | | 118/728 |
| 2014/0199056 | A1 | 7/2014 | Chang et al. | |
| 2014/0273410 | A1 | 9/2014 | Abedijaberi et al. | |
| 2014/0322897 | A1 | 10/2014 | Samir et al. | |
| 2016/0056059 | A1 | 2/2016 | Sun et al. | |
| 2016/0289830 | A1 | 10/2016 | Abedijaberi et al. | |
| 2016/0376706 | A1 | 12/2016 | Miller et al. | |
| 2018/0005856 | A1 | 1/2018 | Chang et al. | |
| 2018/0122638 | A1 | 5/2018 | Jung et al. | |
| 2018/0209043 | A1 | 7/2018 | Lau et al. | |
| 2020/0071832 | A1 | 3/2020 | Lau et al. | |
| 2020/0385866 | A1 | 12/2020 | Srinivasan et al. | |
| 2021/0013055 | A1 | 1/2021 | Schaller et al. | |
| 2021/0189593 | A1 | 6/2021 | Burrows et al. | |

OTHER PUBLICATIONS

International Search Report and Written Opinion dated Aug. 4, 2022 for Application No. PCT/US2022/025772.
International Search Report and Written Opinion for PCT/US2022/026071 dated Aug. 10, 2022.
International Search Report and Written Opinion for International Application No. PCT/US2022/025321 dated Aug. 31, 2022.

* cited by examiner

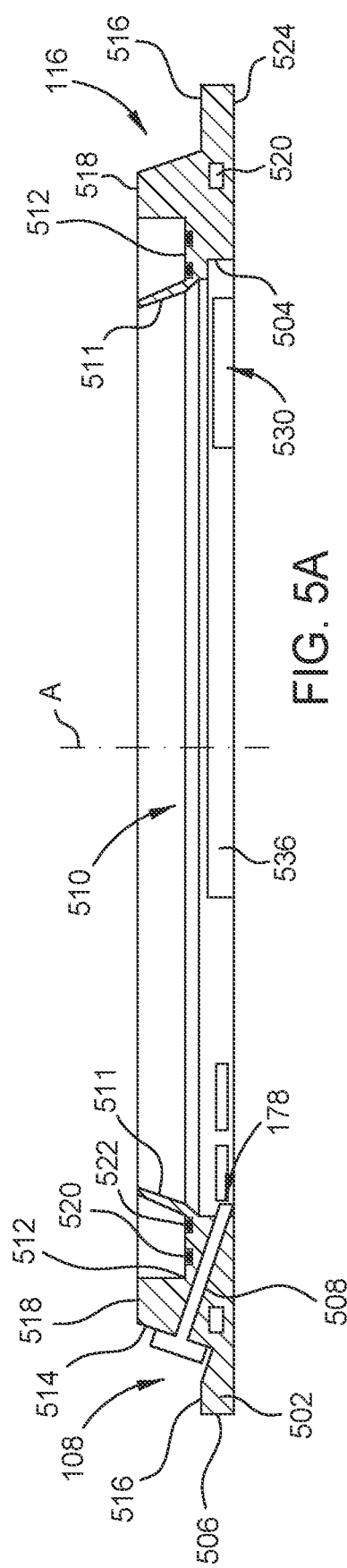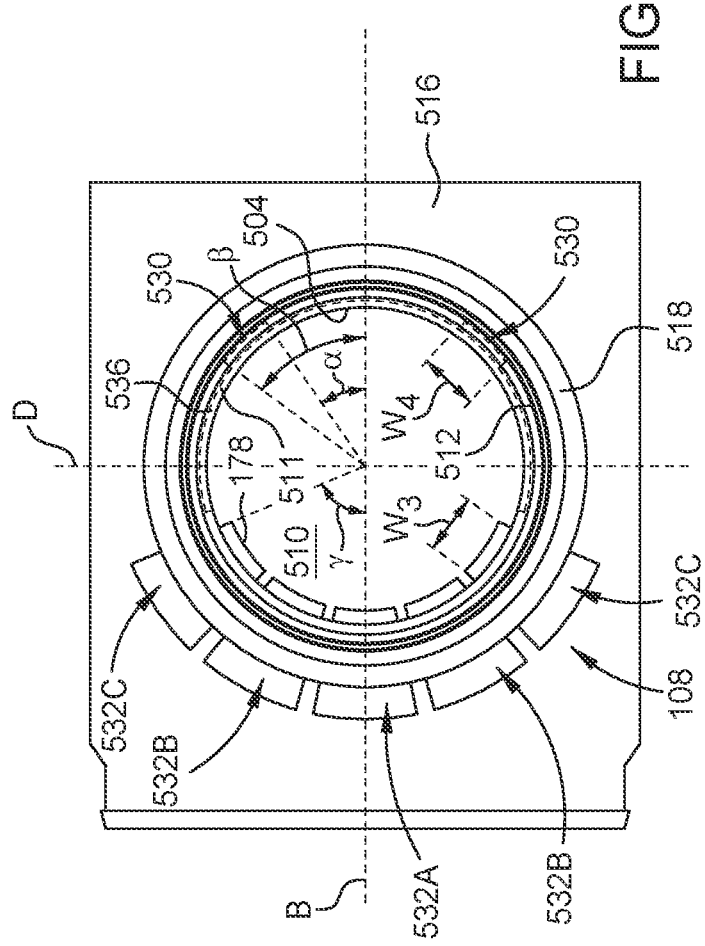

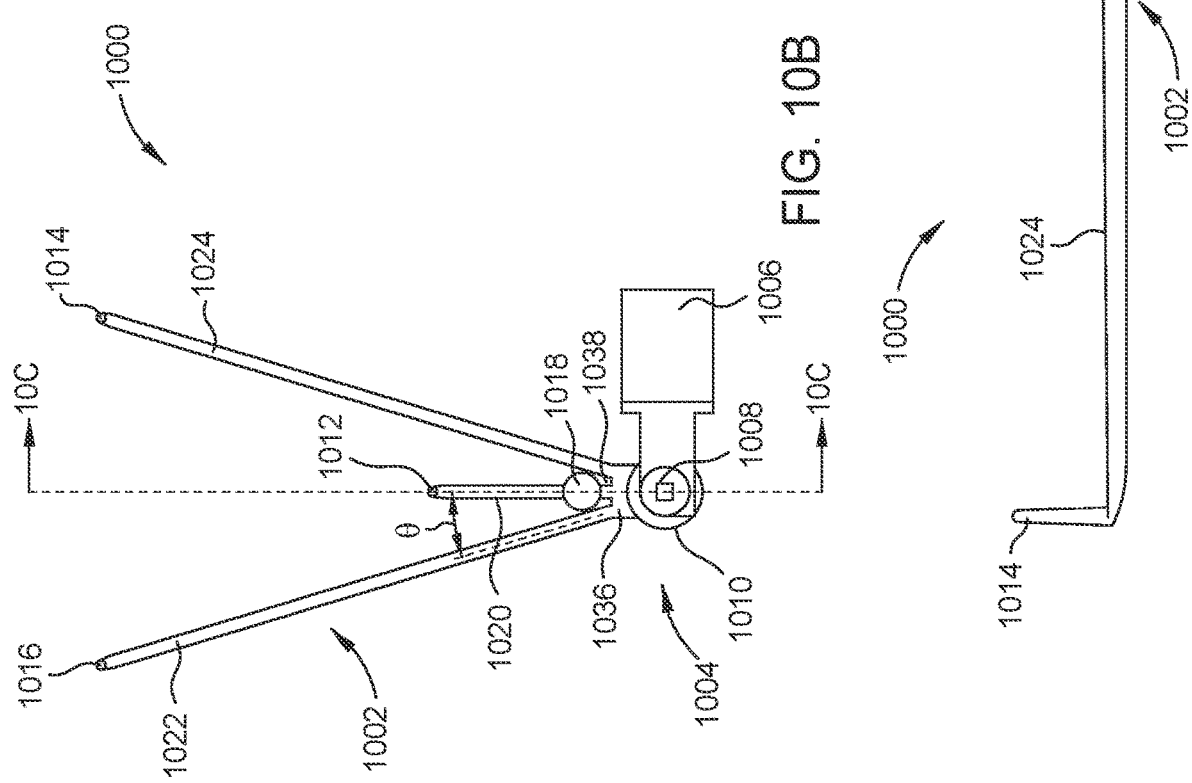
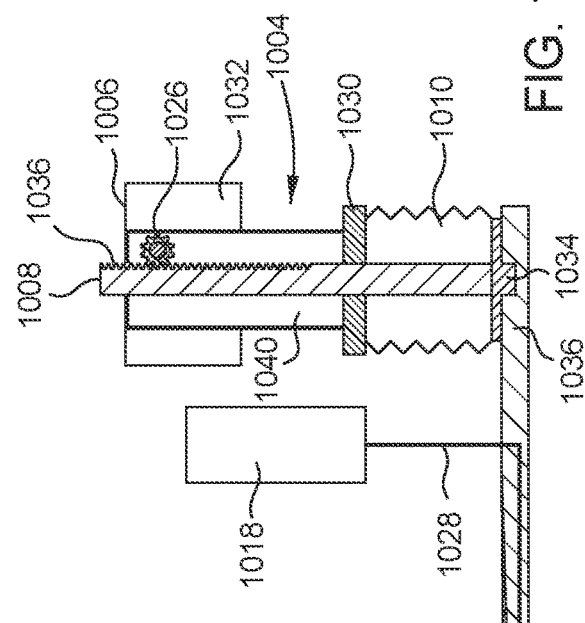

CHAMBER ARCHITECTURE FOR EPITAXIAL DEPOSITION AND ADVANCED EPITAXIAL FILM APPLICATIONS

BACKGROUND

Field

Embodiments of the present disclosure generally relate to apparatus and methods for fabricating semiconductor devices. More specifically, apparatus disclosed herein relate to a chamber body and related components for use in semiconductor processing.

Description of the Related Art

Semiconductor substrates are processed for a wide variety of applications, including the fabrication of integrated devices and microdevices. During processing, the substrate is positioned on a susceptor within a process chamber. The susceptor is supported by a support shaft, which is rotatable about a central axis. Precise control over a heating source, such as a plurality of heating lamps disposed below and above the substrate, allows the substrate to be heated within very strict tolerances. The temperature of the substrate can affect the uniformity of the material deposited on the substrate.

The ability to precisely control substrate temperatures within the process chamber has a significant impact throughput and production yields. Conventional process chambers have difficulty meeting temperature control criteria needed to fabricate next generation devices while meeting ever increasing demands for improved production yields and faster throughput.

Therefore, a need exists for improved process chambers and related components.

SUMMARY

Embodiments described herein include a process chamber for substrate processing comprising. The process chamber includes an upper lamp module, a lower lamp module, a substrate support, and upper window, a lower window, and a chamber body assembly. The substrate support is disposed between the upper lamp module and the lower lamp module. The upper window is disposed between the upper lamp module and the substrate support. The lower window is disposed between the lower lamp module and the substrate support. The chamber body assembly is disposed between the upper lamp module and the lower lamp module and forming a portion of a process volume. The chamber body assembly includes a substrate transfer passage disposed through the chamber body assembly. A lower chamber exhaust passage is disposed opposite the substrate transfer passage and through the chamber body assembly. One or more upper chamber exhaust passages are disposed through the chamber body assembly. Each of the one or more upper chamber exhaust passages have an upper chamber exhaust passage opening disposed above the lower chamber exhaust passage. One or more injector passages are disposed through the chamber body assembly and above the substrate transfer passage.

Another embodiment of a process chamber for substrate processing includes an upper lamp module, a lower lamp module, a substrate support, an upper window, a lower window, and a chamber body assembly. The upper lamp module includes an upper module body with a top surface and a bottom surface. A plurality of lamp apertures are disposed from the bottom surface to the top surface. The substrate support is disposed between the upper lamp module and the lower lamp module. The upper window is disposed between the upper lamp module and the substrate support. The lower window is disposed between the lower lamp module and the substrate support. A chamber body assembly is disposed between the upper lamp module and the lower lamp module and forms a portion of a process volume. The chamber body assembly includes a substrate transfer passage disposed through the chamber body assembly. A lower chamber exhaust passage is disposed opposite the substrate transfer passage and through the chamber body assembly. One or more upper chamber exhaust passages are disposed through the chamber body assembly. Each of the one or more upper chamber exhaust passages have an upper chamber exhaust passage opening disposed above the lower chamber exhaust passage. One or more injector passages are disposed through the chamber body assembly and above the substrate transfer passage.

In yet another embodiment, a process chamber for substrate processing includes an upper lamp module, a lower lamp module, a substrate support, an upper window, a lower window, and a chamber body assembly. The upper lamp module includes an upper module body with a top surface and a bottom surface. A plurality of lamp apertures are disposed from the bottom surface towards the top surface of the upper lamp module. The substrate support is disposed between the upper lamp module and the lower lamp module. The upper window is disposed between the upper lamp module and the substrate support. The lower window is disposed between the lower lamp module and the substrate support. A chamber body assembly is disposed between the upper lamp module and the lower lamp module and forms a portion of a process volume. The chamber body assembly includes a substrate transfer passage disposed therethrough. One or more upper chamber exhaust passages are disposed through the chamber body assembly. Each of the one or more upper chamber exhaust passages have an upper chamber exhaust passage opening in fluid communication with the process volume. A lower chamber exhaust passage is disposed through the chamber body assembly and below the upper chamber exhaust passage openings. One or more injector passages are disposed above the substrate transfer passage.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 5A is a schematic cross sectional view of an inject ring, according to embodiments of the present disclosure.

FIG. 5B is a schematic plan view of the inject ring of FIG. 5A, according to embodiments of the present disclosure.

FIG. 10B is a schematic plan view of the lift arm assembly of FIG. 10A, according to embodiments of the present disclosure.

FIG. 10C is a schematic side sectional view of the lift arm assembly taking along section line 10C-10C of FIG. 10A, according to embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to apparatus for semiconductor processing. More specifically, apparatus disclosed herein relate to a process chamber and its components. The process chamber is configured as a thermal deposition chamber, such as an epitaxial deposition chamber. The process chamber disclosed herein enables improved process gas flow and substrate heating. The process chamber has less expensive components compared to conventional chambers, thus reducing the cost for replacement of portions of the process chamber after the portion of the chamber body is worn or when an improved design to a portion of the chamber body is available. The disclosed process chamber overcomes conventional challenges, including improved process gas flow through the chamber volume and more uniform thermal control, which enables better throughput with increased process yields.

Also disclosed herein are components of the process chamber. The components disclosed herein include an inject ring, a base ring, an upper lamp module, a lower lamp module, a susceptor, a rotation assembly, an upper liner, a lower liner, and one or more heating elements. Each of the process chamber components are used together to flow one or more process gases horizontally across the surface of a substrate. The process chamber components are coupled together and form a process volume in which a substrate is processed, for example, by epitaxial deposition.

Figure 1:
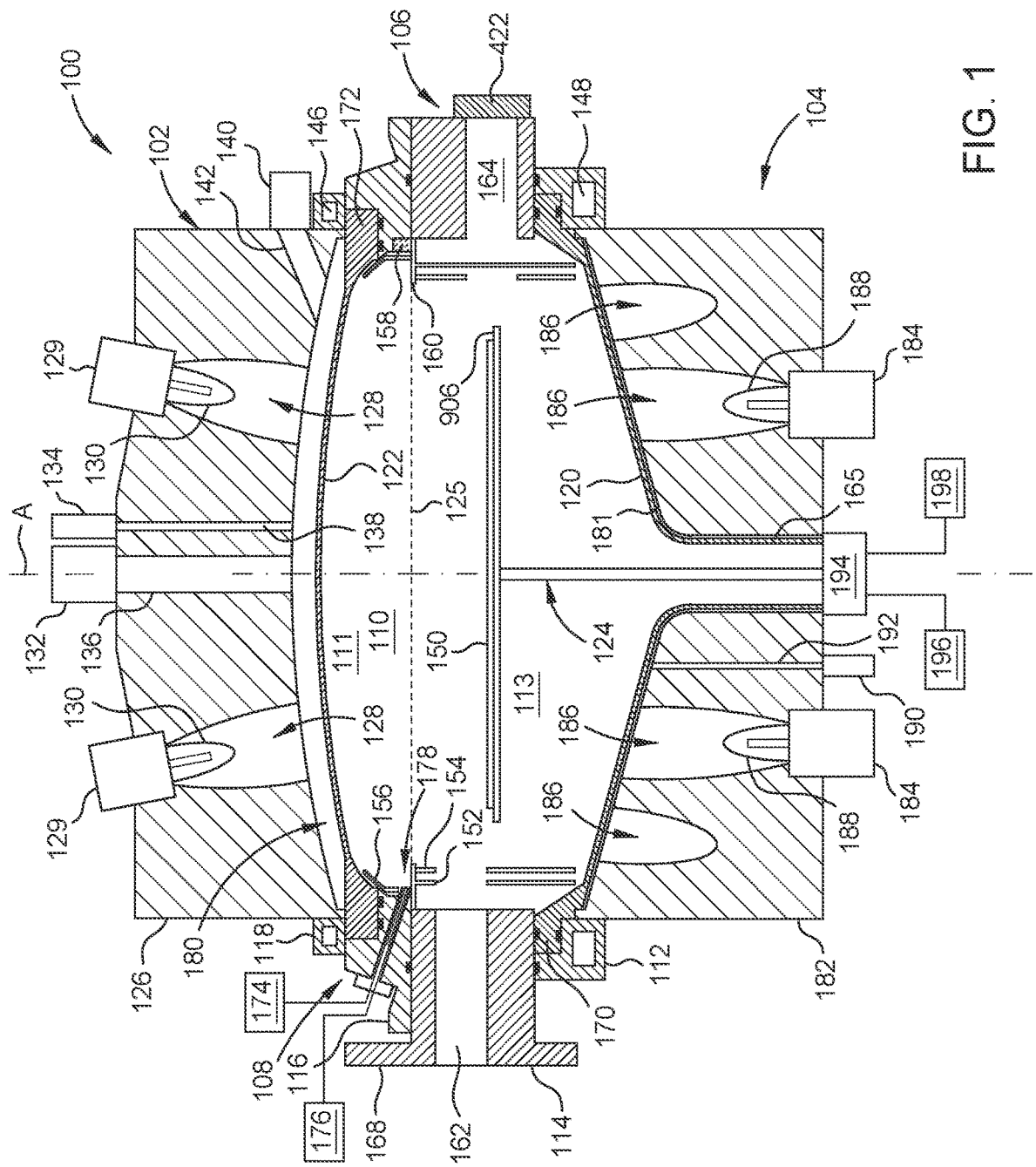
FIG. 1 is a schematic illustration of a process chamber, according to embodiments of the present disclosure.

FIG. 1 is a schematic illustration of a process chamber 100, according to embodiments of the present disclosure. The process chamber 100 is an epitaxial deposition chamber and may be used as part of a cluster tool (not shown). The process chamber 100 is utilized to grow an epitaxial film on a substrate, such as the substrate 150. The process chamber 100 creates a cross-flow of precursors across the top surface of the substrate 150 during processing.

The process chamber 100 includes an upper lamp module 102, a lower lamp module 104, a chamber body assembly 106, a susceptor assembly 124, a lower window 120, and an upper window 122. The susceptor assembly 124 is disposed between the susceptor assembly 124 and the lower lamp module 104. The lower window 120 is disposed between the susceptor assembly 124 and the lower lamp module 104. The upper window 122 is disposed between the susceptor assembly 124 and the upper lamp module 102.

The upper lamp module 102 is disposed over the susceptor assembly 124 and configured to heat a substrate, such as the substrate 150, disposed on the susceptor assembly 124. The upper lamp module 102 includes an upper module body 126 and a plurality of lamp apertures 128 disposed through the upper module body 126. Each of the plurality of lamp apertures 128 includes a lamp 130 disposed therein. Each of the lamps 130 are coupled to a lamp base 129. Each of the lamp bases 129 supports one of the lamps 130 and electrically couples each of the lamps 130 to a power source (not shown). Each of the lamps 129 are secured in a generally vertical orientation within the apertures 128. As described herein, the generally vertical orientation of the lamps 130 is approximately perpendicular to the substrate support surface of the susceptor 124. The vertical orientation of the lamps 130 is not necessarily perpendicular to the substrate support surface, but may also be at an angle of about 30 degrees to about 150 degrees with respect to the substrate support surface 906 (FIG. 9), such as an angle of about 45 degrees to about 135 degrees with respect to the substrate support surface 906, such as an angle of about 70 degrees to about 110 degrees with respect to the substrate support surface 906.

Continuing to refer to FIG. 1, the upper lamp module 102 further includes a heated gas passage 136 and a pyrometer passage 138. A heated gas supply source 132 is fluidly coupled to the heated gas passage 136. The heated gas passage 136 extends from the top surface to the bottom surface of the upper module body 126. The heated gas passage 136 is configured to allow heated gas, such as heated air or a heated inert gas, to flow from the heated gas supply source 132 to the top surface of the upper window 122 to convectively heat the upper window 122. The heated gas is supplied to an upper plenum 180 defined between the upper lamp module 102 and the upper window 122. A heated gas exhaust passage 142 is also disposed through the upper module body 126. The heated gas exhaust passage 142 is coupled to a heated exhaust pump 140. The heated exhaust pump 140 removes gas from the upper plenum 180. The heated exhaust pump 140 may also function as an exhaust pump for the process volume. The heated gas exhaust passage 142, in some embodiments, may be a groove formed along an edge of the upper module body 126 or may be formed through a separate component in fluid communication with the upper plenum 180.

The pyrometer passage 138 is disposed through the upper module body 126 to enable a pyrometer 134, such as a scanning pyrometer, to measure the temperature of the substrate 150. The pyrometer 134 is disposed on top of the upper module body 126 adjacent to the pyrometer passage 138. The pyrometer passage 138 extends from the top surface of the upper module body 126 to the bottom surface adjacent to the upper window 122.

The lower lamp module 104 is disposed below the susceptor assembly 124 and configured to heat a bottom side of the substrate 150 disposed on the susceptor assembly 124. The lower lamp module 104 includes a lower module body 182 and a plurality of lamp apertures 186 disposed through the lower module body 182. Each of the plurality of lamp apertures 186 includes a lamp 188 disposed therein. Each of the lamps 188 are disposed in a generally vertical orientation and coupled to a lamp base 184. Each of the lamp bases 184 supports one of the lamps 188 and electrically coupled each of the lamps 188 to a power source (not shown). As described herein, the generally vertical orientation of the lamps 188 is described with respect to the substrate support surface 906 (FIG. 9) of the susceptor 124. The generally vertical orientation is not necessarily perpendicular to the substrate support surface 906, but may also be at an angle of about 30 degrees to about 150 degrees with respect to the substrate support surface 906, such as an angle of about 45 degrees to about 135 degrees with respect to the substrate support surface 906, such as an angle of about 70 degrees to about 110 degrees with respect to the substrate support surface 906.

The lower lamp module 104 further includes a susceptor shaft passage 195 and a pyrometer passage 192. A support shaft 904 (FIG. 9) of the susceptor 124 is disposed through the susceptor shaft passage 195. The susceptor shaft passage 195 is disposed through the middle of the lower module body 182. The susceptor shaft passage 195 is configured to allow the support shaft 904 of the susceptor 124 and a portion of the lower window 120 to pass through the lower module body 182.

Continuing to refer to FIG. 1, the pyrometer passage 192 is disposed through the lower module body 182 to enable a pyrometer 190, such as a scanning pyrometer, to measure the temperature of the bottom surface of the substrate 150 or the bottom surface of the substrate support. The pyrometer 190 is disposed below the lower module body 182 adjacent to the pyrometer passage 192. The pyrometer passage 192 is disposed from the bottom surface of the lower module body 182 to the top surface of the lower module body 182 adjacent to the lower window 120.

The chamber body assembly 106 includes an inject ring 116 and a base ring 114. The inject ring 116 is disposed on top of the base ring 114. The inject ring 116 includes one or more gas injectors 108 disposed therethrough. The base ring 114 includes a substrate transfer passage 162, one or more upper chamber exhaust passages 426 (FIG. 4E), and a lower chamber exhaust passage 164 disposed therethrough. The substrate transfer passage 162 is disposed opposite the one or more upper chamber exhaust passages 426 and the lower chamber exhaust passage 164. Each of the one or more upper chamber exhaust passages 426 are coupled to an exhaust module 422.

An upper chamber 111 is the portion of a process volume 110 in which the substrate 150 is processed and process gases are injected. The lower chamber 113 is the portion of the process volume 110 in which the substrate 150 is loaded onto the susceptor assembly 124. The upper chamber 111 may also be understood as the volume above a susceptor 902 (FIG. 9) of the susceptor assembly 124 while the susceptor assembly 124 is in a processing position. The lower chamber 113 is understood to be the volume below the susceptor 902 (FIG. 9) of the susceptor assembly 124 while the susceptor assembly 124 is in the processing position. The processing position (not shown) is the position wherein the substrate 150 is disposed even with or above the horizontal plane 125. The horizontal plane 125 is the plane through which the inject ring 116 and the base ring 114 contact one another.

The one or more upper chamber exhaust passages 426 and the lower chamber exhaust passage 164 are coupled to one or more exhaust pumps (not shown). The one or more exhaust pumps are configured to remove exhaust gases from the process volume 110 via the one or more upper chamber exhaust passages 426 and the lower chamber exhaust passage 164. In some embodiments, each of the upper chamber exhaust passages 426 and the lower chamber exhaust passage 164 are coupled to a single exhaust pump using a plurality of conduits. In another embodiment, the upper chamber exhaust passages 426 are coupled to a different exhaust pump than the lower chamber exhaust passage 164.

The substrate transfer passage 162 is formed through the base ring 114 and is configured to allow a substrate to pass therethrough from a transfer chamber of a cluster tool (not shown). A flange 168 is attached to one end of the base ring 114 to enable the attachment of the process chamber 100 to a cluster tool (not shown). The substrate transfer passage 162 passes through the flange 168.

An upper cooling ring 118 and a lower cooling ring 112 are disposed on opposite sides of the chamber body assembly 106. The upper cooling ring 118 is disposed on top of the inject ring 116 and is configured to cool the inject ring 116. The lower cooling ring 112 is disposed below the base ring 114 and is configured to cool the base ring 114. The upper cooling ring 118 includes a coolant passage 146 disposed therethrough. The coolant which is circulated through the coolant passage 146 may include water or oil in some embodiments. The lower cooling ring 112 includes a coolant passage 148 disposed therethrough. The coolant which is circulated through the coolant passage 148 is similar to the coolant circulated through the coolant passage 146 of the upper cooling ring 118. In some embodiments, the upper cooling ring 118 and the lower cooling ring 112 assist in securing the inject ring 116 and the base ring 114 in place. The upper cooling ring 118 may partially support the upper lamp module 102 while the lower cooling ring 112 may partially support the base ring 114 and the inject ring 116.

The use of the upper cooling ring 118 and the lower cooling ring 112 reduces the temperature of the inject ring 116 and the base ring 114 without the need for additional cooling channels being disposed through the inject ring 116 and the base ring 114 as present in conventional rings. This reduces the cost of the production of the inject ring 116 and the base ring 114, which are more frequently replaced than the upper cooling ring 118 and the lower cooling ring 112.

In some embodiments, the inject ring 116 may have an additional coolant passage 521 (FIG. 5A) disposed therethrough.

The one or more gas injectors 108 of the inject ring 116 are disposed through one or more openings within the inject ring 116. In embodiments described herein, there are a plurality of gas injectors 108 disposed through the inject ring 116. The one or more gas injectors 108 are configured to supply process gases to a process volume 110 via one or more gas outlets 178. A single one of the one or more gas injectors 108 is shown in FIG. 1. The gas injector 108 is shown as being disposed so the one or more gas outlets 178 are pointed downward toward the susceptor 124 and the substrate 150. The downward angle of the gas injector 108 may be an angle of greater than about 5 degrees from the horizontal, such as greater than about 10 degrees from the horizontal. Each of the one or more gas outlets 178 are fluidly coupled to one or more process gas supply sources, such as the first process gas supply source 174 or the second process gas supply source 176. In some embodiments, only a first process gas supply source 174 is utilized. In embodiment in which both the first process gas supply source 174 and the second process gas supply source 176 are utilized, there are two gas outlets 178 within each gas injector 108. The two gas outlets 178 are disposed in a stacked fashion and enable mixing of the gases only after the gases enter the process volume 110. In some embodiments, the first process gas supply source 174 is a process gas while the second process gas supply source 176 is a cleaning gas. In other embodiments, both the first process gas supply source 174 and the second process gas supply source 176 are process gases.

The upper window 122 is disposed between the inject ring 116 and the upper lamp module 102. The upper window 122 is an optically transparent window, such that radiant energy produced by the upper lamp module 102 may pass therethrough. In some embodiments, the upper window 122 is formed of a quartz or a glass material. The upper window 122 is a dome shape and in some embodiments is described as an upper dome. The outer edges of the upper window 122 form peripheral supports 172. The peripheral supports 172 are thicker than the central portion of the upper window 122. The peripheral supports 172 are disposed on top of the inject ring 116. The peripheral supports 172 connect to the central portion of the upper window 122 and are formed of the optically transparent material of the central portion of the upper window 122.

The lower window 120 is disposed between the base ring 114 and the lower lamp module 104. The lower window 120 is an optically transparent window, such that radiant energy produced by the lower lamp module 104 may pass therethrough. In some embodiments, the lower window 120 is formed of a quartz or a glass material. The lower window 120 is a dome shape and in some embodiments is described as a lower dome. The outer edges of the lower window 120 form peripheral supports 170. The peripheral supports 170 are thicker than the central portion of the lower window 120. The peripheral supports 170 connect to the central portion of the lower window 120 and are formed of the same optically transparent material.

A variety of liners and heaters are disposed inside of the chamber body assembly 106 and within the process volume 110. As shown in FIG. 1, there is an upper liner 156 and a lower liner 154 disposed within the chamber body assembly 106. The upper liner 156 is disposed above the lower liner 154 and inward of the inject ring 116. The lower liner 154 is disposed inward of the base ring 114. The upper liner 156 and the lower liner 154 are configured to be coupled together while in the process volume. The upper liner 156 and the lower liner 154 are configured to shield the inner surfaces of the inject ring 116 and the base ring 114 from the process gases within the process volume. The upper liner 156 and the lower liner 154 further serve to reduce heat loss from the process volume to the inject ring 116 and the base ring 114. Reduced heat loss improves heating uniformity of the substrate 150 and enables more uniform deposition on the substrate 150 during processing.

An upper heater 158 and a lower heater 152 are also disposed within the chamber body assembly 106 and the process volume 110. As shown in FIG. 1, the upper heater 158 is disposed between the upper liner 156 and the inject ring 116 while the lower heater 152 is disposed between the lower liner 154 and the base ring 114. Both of the upper heater 158 and the lower heater 152 are disposed inward of the chamber body assembly 106 to enable more uniform heating of the substrate 150 while the substrate 150 is within the process chamber 100. The upper heater 158 and the lower heater 152 reduce heat loss to the walls of the chamber body assembly 106 and create a more uniform temperature distribution around the surfaces forming the process volume 110. Each of the upper liner 156, the lower liner 154, the upper heater 158, and the lower heater 152 are coupled to a flange 160 disposed within the process volume 110. The flange 160 is a horizontal surface configured to be secured between a portion of the inject ring 116 and the base ring 114 to enable securing of each of the upper liner 156, the lower liner 154, the upper heater 158, and the lower heater 152. In embodiments described herein, both the upper heater 158 and the lower heater 152 may be configured to have a heated fluid run therethrough or may be resistive heaters. The upper heater 158 and the lower heater 152 are further shaped to accommodate openings through the inject ring 116 and the base ring 114.

The susceptor assembly 124 is disposed within the process volume 110 and is configured to support the substrate 150 during processing. The susceptor assembly 124 includes a planar upper surface for supporting the substrate 150 and a shaft which extends through a portion of the lower window 120 and the lower lamp module 104. The susceptor assembly 124 is coupled to a movement assembly 194. The movement assembly 194 includes a rotation assembly 196 and a lift assembly 198. The rotation assembly 196 is configured to rotate of the susceptor assembly 124 about a central axis A, while the lift assembly 198 is configured to move the susceptor assembly 124 linearly within the process volume 110 along the central axis A.

Figure 2A:
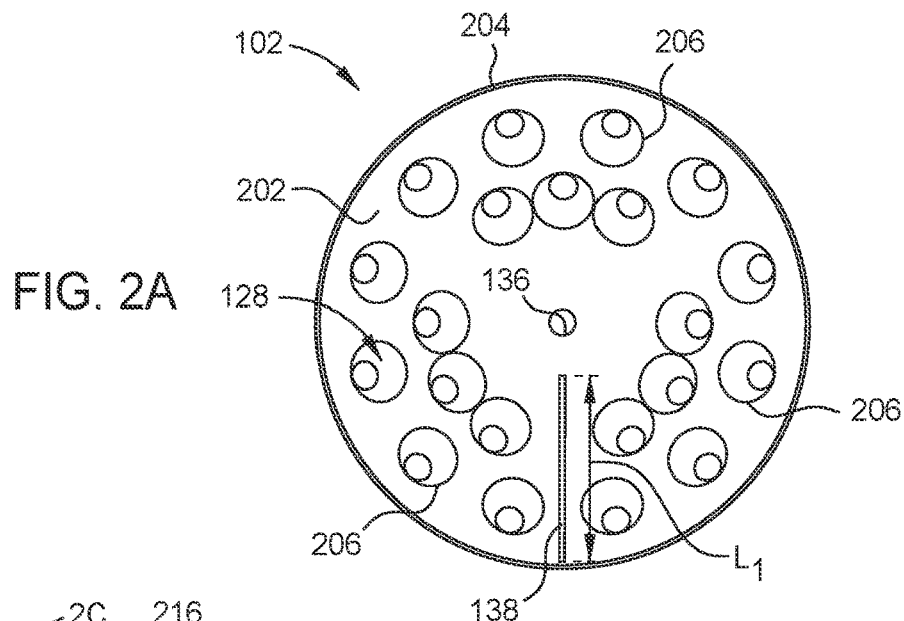
FIG. 2A is a schematic bottom view of an upper lamp module, according to embodiments of the present disclosure.

FIG. 2A is a schematic bottom view of an upper lamp module 102, according to embodiments of the present disclosure. The upper module body 126 of the upper lamp module 102 further includes a bottom surface 202, a top surface 214 (FIG. 2B) and a support ridge 204 disposed around an outer edge of the bottom surface 202. The support ridge 204 is configured to support the upper module body 126 by contacting a portion of the upper window 122 (FIG. 1), while providing a separation between the rest of the bottom surface 202 and the upper window 122. The support ridge 204 disposed on the outside of the bottom surface 202 distributes the weight of the upper module body 126 around the peripheral supports 172 or a section of the chamber body assembly 106 instead of being solely support by the central portion of the upper window 122. This reduces the probability of the upper window 122 from fracturing and forms the upper plenum 180. The upper plenum 180 enables the upper window 122 to be heated or cooled using a gas source, such as the heated gas source 132. The bottom surface 202 is a curved surface and has a similar shape to the central portion of the upper window 122. The bottom surface 202 has a concave surface.

Each of the lamp apertures 128 include an inner wall 206. Each of the inner walls 206 form a circular or elliptical opening to the lamp apertures 128 at the bottom surface 202. Each of the inner walls 206 are configured to reflect radiative energy to enable focusing of the radiative energy from the lamps 130 (FIG. 1) and allow a controlled energy distribution across the substrate 150. In embodiments described herein, each of the inner walls 206 are curved, such that the inner walls 206 form portions of an ellipse. In other embodiments, the inner walls 206 are vertical walls. The inner walls 206 have a reflectance of greater than about 90%, such as greater than about 98% for wavelengths between about 700 nm to about 15000 nm, such as about 700 nm to about 1000 nm or about 1000 nm to about 15000 nm. The inner walls 206 may include a reflective coating disposed thereon, such as a coating of gold, polished aluminum, or other polished materials with a high reflectivity for infrared wavelengths. In some embodiments, the upper module body 126 is formed of a reflective material, such as aluminum or steel. In some embodiments, the upper module body 126 is formed from a first material, such as aluminum or steel, and plated in a second material. The second material may be any one of copper, nickel, brass, bronze, silver, gold, aluminum, or an alloy thereof. The second material may be polished to increase the reflectivity. The bottom surface 202 is also reflective in some embodiments. The bottom surface 202 may have a reflectance of greater than about 90%, such as greater than about 98% for wavelengths between about 700 nm to about 15000 nm, such as about 700 nm to about 1000 nm or about 1000 nm to about 15000 nm. The bottom surface 202 is made from or coated with a material similar to the inner walls 206.

The inner walls 206 extend vertically through the upper module body 126, such that the inner walls 206 extend away from the bottom surface 202 and towards the top surface 214. The generally vertical orientation of the inner walls 206 and therefore the lamp apertures 128 enables more focused distribution of radiant energy on a substrate. The generally vertical orientation of the lamp apertures 128 further reduces the radiant energy absorbed by the upper module body 126. The inner walls 206 form a portion of a spheroid. Each of the lamp apertures 128 include a central axis about which the inner walls 206 are formed. The central axis through each of the lamp apertures 128 have a common intersection point below bottom surface 202 of the upper lamp module 102, such that each of the lamp apertures 128 face inward toward the central axis A.

Figure 2B:
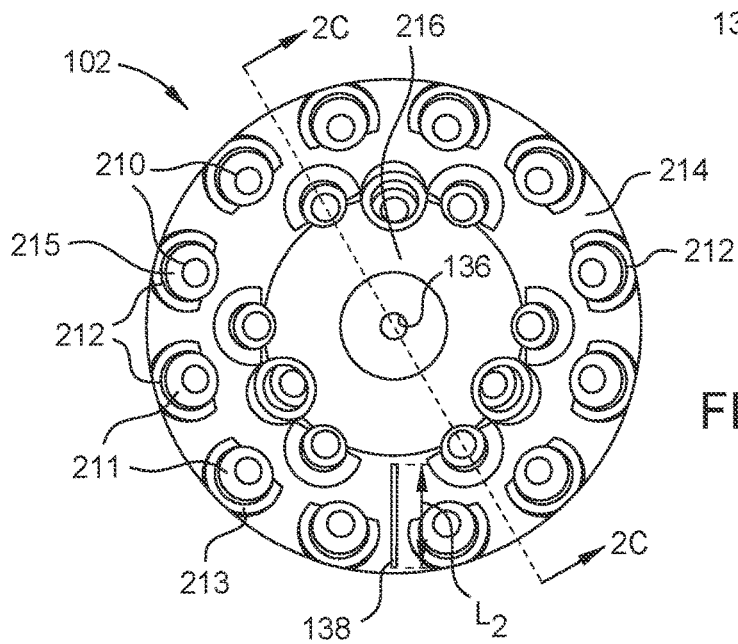
FIG. 2B is a schematic plan view of the upper lamp module of FIG. 2A, according to embodiments of the present disclosure.

As shown herein, the pyrometer passage 138 is a slit disposed through the upper module body 126. The pyrometer passage 138 has a first length $L_1$ at the bottom surface 202, and a second length $L_2$ at the top surface 214 (FIG. 2B). The first length $L_1$ is longer than the second length $L_2$. The first length $L_1$ is longer than the second length $L_2$ to reduce the opening at the top surface 214 while allowing full scanning of the top of the substrate 150 by a scanning pyrometer, such as the pyrometer 134. The heated gas passage 136 is disposed through the center of the upper module body 126.

FIG. 2B is a schematic plan view of the upper lamp module 102 of FIG. 2A. As shown in FIG. 2B, each of the plurality of lamp apertures 128 further includes a lamp base support 212 and a bulb opening 210 disposed through each of the lamp base supports 212. The bulb openings 210 connect the lamp base supports 212 and the reflective inner walls 206. The lamp base supports 212 are stepped surfaces disposed around the bulb openings 210. Each lamp base support 212 includes a center bore 211 and an arc shaped recess 213 that surrounds the center bore. The lamp base supports 212 are configured to support a lamp base 129. The bulb openings 210 are circular openings disposed through a bottom surface 215 of the lamp base supports 212. The bulb openings 210 are sized to allow the bulb of the lamps 130 to pass therethrough.

The top surface 214 of the upper lamp module 102 includes a raised portion 216. The raised portion 216 is raised slightly from the outer portion of the top surface 214. The raised portion 216 increases the structural strength of the upper lamp module 102 and reduces deflection of the upper lamp module 102 with the addition of lamps 130 and measurement tools, such as a pyrometer 134.

Figure 2C:
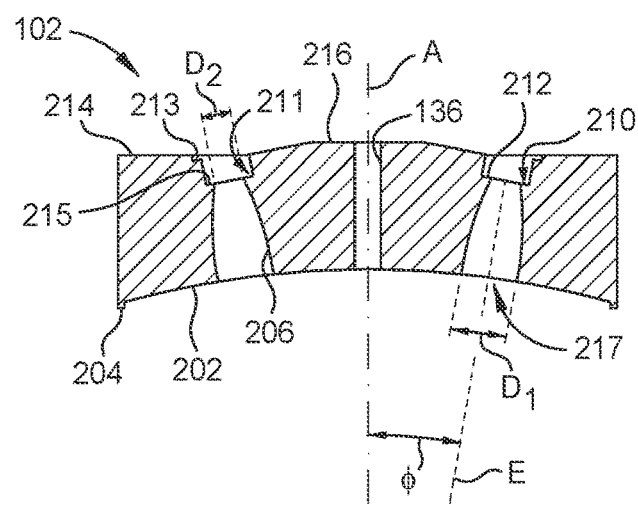
FIG. 2C is a schematic cross sectional view of the upper lamp module taken through section line 2C-2C of FIG. 2A, according to embodiments of the present disclosure.

FIG. 2C is a schematic cross sectional view of the upper lamp module of FIGS. 2A-2B through the section line 2C-2C. The upper module body 126 is centered about the central axis A. Each of the reflective inner walls 206 are configured to reflect light around the lamp apertures 128 from the bulb and direct light toward the substrate 150 (FIG. 1) through the opening 217 formed by the inner walls 206. The opening 217 is disposed at the intersection of the inner walls 206 and the bottom surface 202. The walls of the inner wall 206 and the opening 217 of one of the lamp apertures 128 circumscribed a lamp aperture axis E. The lamp opening axis E is a centerline through the lamp aperture 128 and is disposed at an angle $\phi$ with respect to the central axis A. The angle $\phi$ is less than about 45 degrees, such as less than about 30 degrees, such as less than about 20 degrees. Each of the lamp apertures 128 include a similar lamp aperture axis E and are disposed at an angle $\phi$ with respect to the central axis A. Not all lamp aperture axes E have the same angle $\phi$, but are angled within the angle $\phi$ range described above.

Each of the openings 217 have a first diameter $D_1$ at the bottom surface 202. The first diameter $D_1$ is about 10 mm to about 50 mm, such as about 20 mm to about 40 mm. The first diameter $D_1$ is configured to control the distribution of radiant energy and the focal point of the radiant energy leaving each of the plurality of lamp apertures 128. Each of the bulb openings 210 has a second diameter $D_2$. The lamp aperture axis E similarly passes through the center of the bulb openings 210, such that the opening 217 and the bulb opening 210 are concentric about the lamp aperture axis E. The second diameter $D_2$ is about 5 mm to about 40 mm, such as about 10 mm to about 30 mm. The second diameter $D_2$ is large enough to allow the bulb of one of the lamps 130 to pass therethrough, but small enough to reduce heat loss through the bulb openings 210. In some embodiments, the ratio of the size of the first diameter $D_1$ to the size of the second diameter $D_2$ is about 2:1 to about 5:4, such as about 2:1 to about 4:3, such as about 2:1 to about 3:2. The ratio of the first diameter $D_1$ to the second diameter $D_2$ configured to produce a desired energy distribution on a substrate disposed below the upper module body 126. In some embodiments, the largest diameter of the bulb of each of the lamps 130 is less than 1 mm smaller than the second diameter $D_2$.

The plurality of lamp apertures 128 are disposed in distinctive zones. As shown herein, the plurality of lamp apertures 128 are disposed in three zones. The three zones may each be roughly pie-shaped, such that each of the zones form a sector of a circle. Each sector contains one of the groups of lamp apertures 128. Each sector encompasses about 120 degrees of the upper lamp module 102. Each zone contains about 5-10 lamp apertures 128, such as about 6-8 lamp apertures 128 within the sector. The zones are each arranged to heat different portions of a substrate. Each of the zones of the plurality of lamp apertures 128 includes an inner subset of lamp apertures 128 and an outer subset of lamp apertures 128. Within the inner subset of lamp apertures 128 are multiple lamp apertures 128. The lamp apertures 128 within the inner subset of lamp apertures 128 have a small distance between each other. The small distance is less than the distance from one of the lamp apertures 128 within the inner subset to any lamp aperture 128 within a second inner subset of lamp apertures 128 within an adjacent zone. The lamp apertures 128 within the outer subset of lamp apertures 128 are spaced uniformly on the upper lamp module 102. Each lamp aperture 128 within the outer subset of lamp apertures 128 are an equal distance from an adjacent lamp aperture 128 within a second outer subset as an adjacent lamp aperture 128 within the same outer subset.

Other arrangements of the plurality of lamp apertures 128 are also contemplated and may include arranging the plurality of lamp apertures 128 in a plurality of concentric rings or in an even distribution across the upper lamp module 102.

Figure 3A:
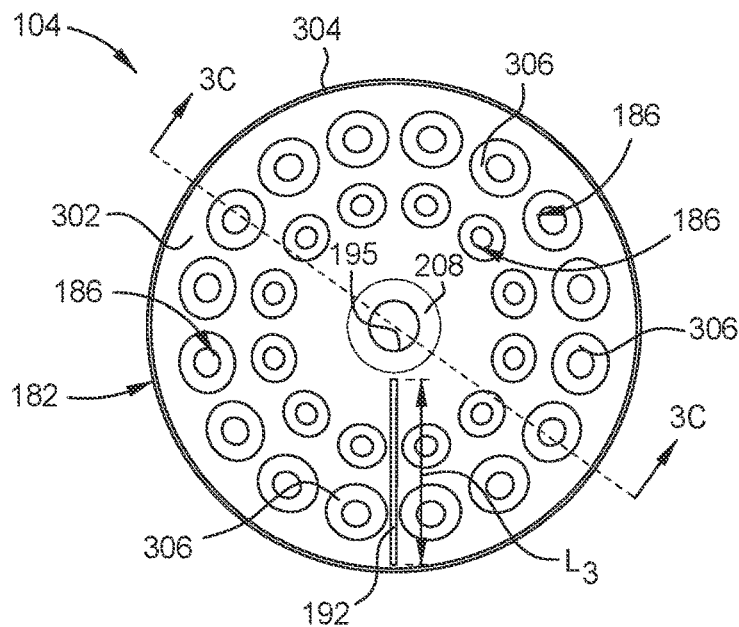
FIG. 3A is a schematic bottom view of a lower lamp module, according to embodiments of the present disclosure.

FIG. 3A is a schematic top view of the lower lamp module 104. The lower module body 182 of the lower lamp module 104 further includes a top surface 302, a bottom surface 314 (FIG. 3B) and a support ridge 304 disposed around an outer edge of the top surface 302. The support ridge 304 is a ring disposed around the top surface 302 of the lower module body 182 and extending outward from the lower module body 182. The support ridge 304 is configured to separate the top surface 302 of the lower module body 182 from the lower window 120 by contacting a portion of the lower window 120 (FIG. 1), while providing a separation between the rest of the bottom surface 202 and the lower window 120. The support ridge 304 enables the lower module body 182 to only contact the peripheral supports 170 or a section of the chamber body assembly 106 instead of the central portion of the lower window 120. This reduces the likelihood of the lower window 120 fracturing and forms a lower plenum 181. The top surface 202 is an angled surface and has a similar shape to the central portion of the lower window 120. In embodiments described herein, the top surface 202 is a concave surface.

Each of the lamp apertures 186 include an inner wall 306. Each of the inner walls 306 are similar to the inner walls 206 of the upper lamp module 102. The inner walls 306 of the lamp apertures 186 are configured to reflect radiative energy to enable focusing of the radiative energy from the lamps 188 (FIG. 1) and allow a controlled energy distribution across the substrate 150. Each of the inner walls 306 form a circular or elliptical opening to the lamp apertures 186 at the top surface 302.

The inner walls 306 extend vertically through the lower module body 182, such that the inner walls 306 extend away from the top surface 302 and towards the bottom surface 314. The vertical orientation of the inner walls 306 and therefore the lamp apertures 186 enables more focused distribution of radiant energy on a substrate. The vertical orientation of the lamp apertures 186 further reduces the radiant energy absorbed by the lower module body 182.

In some embodiments, the lower module body 182 is formed from a first material, such as aluminum or steel, and plated in a second material. The second material may be any one of copper, brass, bronze, silver, gold, aluminum, or an alloy thereof. In some embodiments, the lower module body 182 does not include a second material coating and is instead a single material. The lower module body 182 may have a polished top surface 302. The top surface 302 is also reflective in some embodiments. The top surface 302 may have a reflectance of greater than about 90%, such as greater than about 98% for wavelengths between about 700 nm to about 15000 nm, such as about 700 nm to about 1000 nm or about 1000 nm to about 15000 nm. The top surface 302 is made from or coated with a material similar to the reflective inner walls 306.

Figure 3B:
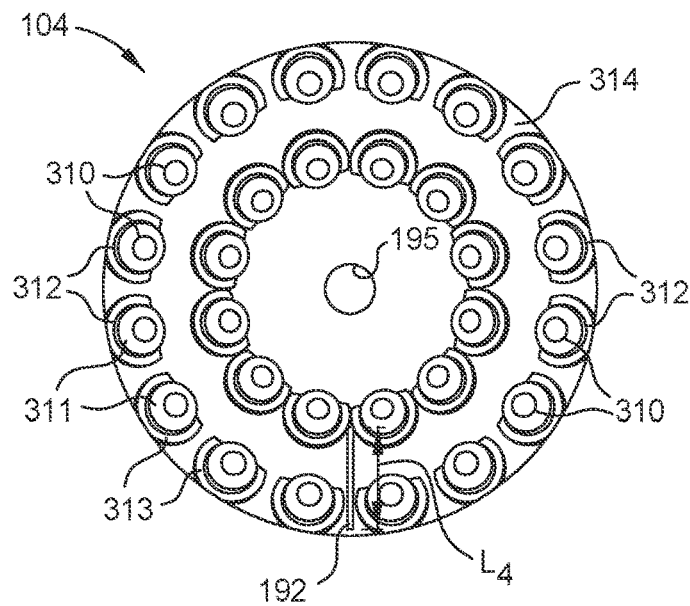
FIG. 3B is a schematic plan view of the lower lamp module of FIG. 3A, according to embodiments of the present disclosure.

As shown herein, the pyrometer passage 192 is a slit disposed through the lower module body 182. The pyrometer passage 192 has a third length $L_3$ at the top surface 302, and a fourth length $L_4$ at the bottom surface 314 (FIG. 3B). The third length $L_3$ is longer than the fourth length $L_4$. The third length $L_3$ is longer than the fourth length $L_4$ to reduce the opening at the bottom surface 314 while allowing full scanning of the bottom of the substrate 150, or the bottom of a susceptor, by a scanning pyrometer, such as the pyrometer 190.

As shown in FIG. 3A, the susceptor shaft passage 195 is disposed through the center of the lower module body 182. The susceptor shaft passage 195 is disposed between and connects the top surface 302 and the bottom surface 314 of the lower module body 182. The portion of the susceptor shaft passage 195 adjacent to the top surface 302 includes a curved surface 208. The curved surface 208 is configured to follow the shape of the lower window 120 as the lower window 120 is curved to pass through the susceptor shaft passage 195. The curved surface 208 connects the bottom surface 314 and the inner surface of the susceptor shaft passage 195.

FIG. 3B is a schematic plan view of the lower lamp module 104 of FIG. 3A, according to embodiments of the present disclosure. As shown in FIG. 3B, each of the plurality of lamp apertures 186 further includes a lamp base support 312 and a bulb opening 310 disposed through each of the lamp base supports 312. The bulb openings 310 connect the lamp base supports 312 and the inner walls 306. The lamp base supports 312 are stepped surfaces disposed around the bulb openings 310. Each lamp base support 312 includes a center bore 311 and an arc shaped recess 313 that surrounds the center bore. The lamp base supports 312 are configured to support and/or couple to a lamp base 184. The bulb openings 310 are circular openings disposed through a top surface of the lamp base supports 312. The bulb openings 310 are sized to allow the bulb of the lamps 188 to pass therethrough.

Figure 3C:
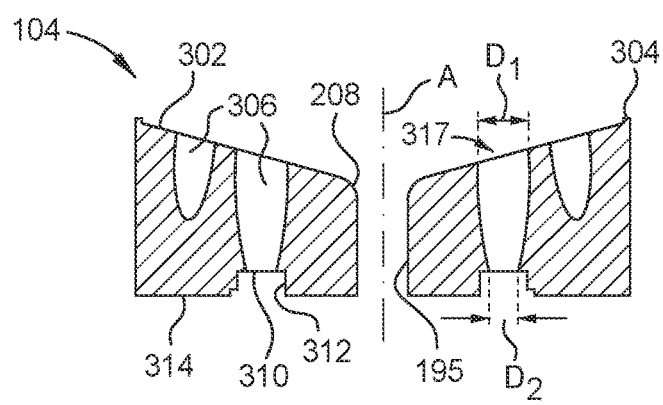
FIG. 3C is a schematic cross sectional view of the lower lamp module taken through section line 3C-3C of FIG. 3A, according to embodiments of the present disclosure.

FIG. 3C is a schematic cross sectional view of the lower lamp module 104 of FIG. 3A through the plane 3C-3C. As shown in FIG. 3C the lower module body 182 is centered about the central axis A. In some embodiments, intersection of the inner walls 306 and the top surface 302 forms an opening 317. The opening 317 has a first diameter $D_1$. In some embodiments, the opening 317 is an ellipse or an oval. In these embodiments, the first diameter $D_1$ would be the major axis length of the opening 317. The first diameter $D_1$ is similar to the first diameter $D_1$ as described with reference to the upper module body 126. Each of the bulb openings 310 has a second diameter $D_2$. The second diameter $D_2$ is similar to the second diameter $D_2$ as described with reference to the upper module body 126. In some embodiments, the largest diameter of the bulb of each of the lamps 188 is less than 1 mm smaller than the second diameter $D_2$.

Each of the reflective inner walls 306 are configured to reflect light around the lamp apertures 186 from the bulb and direct light toward the substrate 150 (FIG. 1) through the opening 317 formed by the inner walls 306. The opening 317 is disposed at the intersection of the inner walls 306 and the top surface 302. The walls of the inner wall 306 and the opening 317 of one of the lamp apertures 186 circumscribed a lamp aperture axis F. The lamp opening axis F is a centerline through the lamp aperture 186. The lamp aperture axis F similarly passes through the center of the bulb openings 310, such that the opening 317 and the bulb opening 310 are concentric about the lamp aperture axis F.

The plurality of lamp apertures 186 are disposed in zones. As shown herein, the plurality of lamp apertures 186 are disposed in two concentric zones. Each zone includes a ring of lamp apertures 186 disposed on a common diameter about the susceptor shaft passage 195. Each ring of lamp apertures 186 includes at least three lamp apertures 186. In embodiments described herein, an inner zone includes a ring with 8 to 16 lamp apertures 186, such as 10 to 14 lamp apertures 186. An outer zone includes a ring with 12 to 20 lamp apertures 186, such as 14 to 18 lamp apertures. As described herein, the outer zone includes more lamp apertures 186 than the inner zone.

Figure 4A:
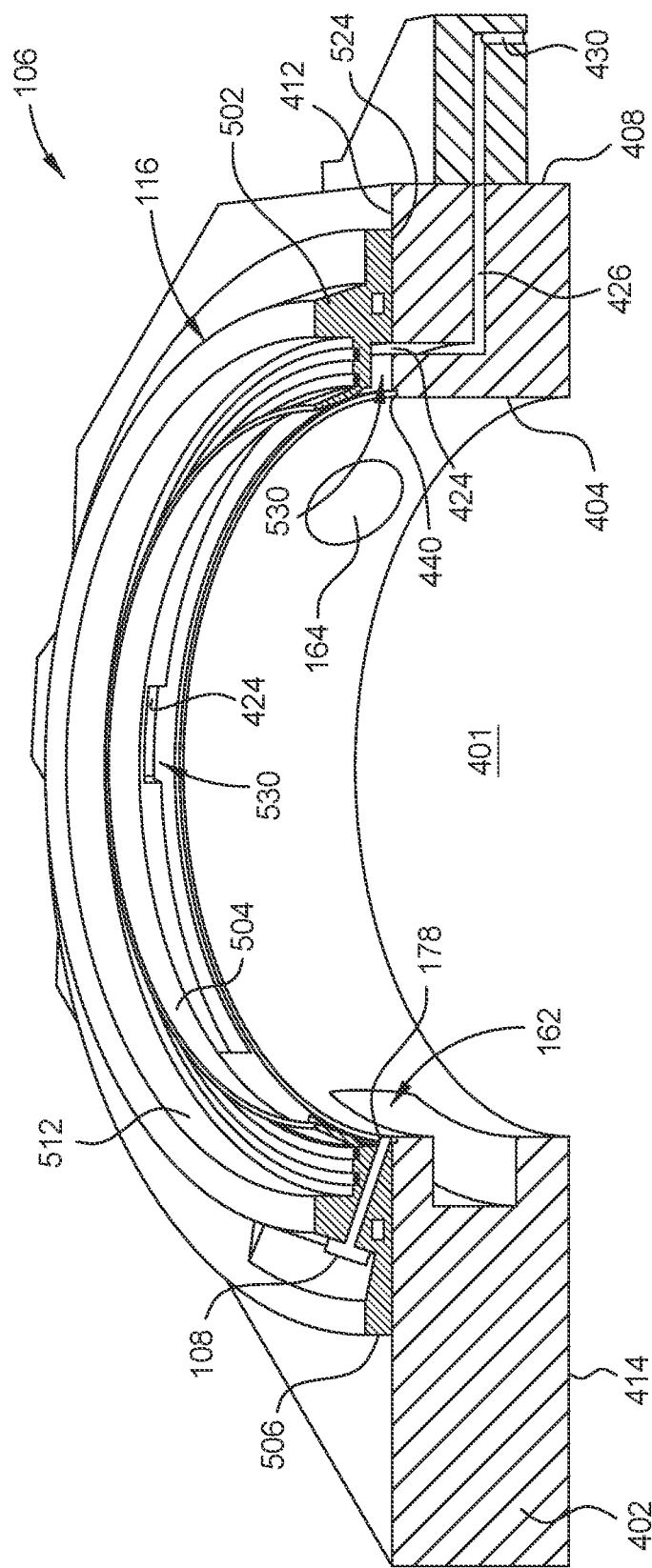
FIG. 4A is a schematic cross sectional perspective view of a chamber body assembly, according to embodiments of the present disclosure.

FIG. 4A is a schematic cross sectional perspective view of the chamber body assembly 106, according to embodiments of the present disclosure. The chamber body 106 includes the inject ring 116 disposed on top of and coupled to the base ring 114. The inject ring 116 includes the one or more gas injectors 108. The inject ring 116 includes an inner surface 504 and the base ring 114 includes an inner surface 404. The inner surfaces 404, 504 of both the base ring 114 and the inject ring 116 are aligned with one another, such that the inner surfaces 404, 504 have the same diameter for at least a portion of the circumference of the base ring 114 and the inject ring 116. The inner surfaces 404, 504 of the base ring 114 and the inject ring 116 form a central opening 401. The central opening 401 includes both an opening 410 of the base ring 114 and an opening 510 of the inject ring 116. A top surface 412 of the base ring is in contact with a bottom surface 524 of the inject ring 116.

One or more gas injectors 108 are disposed on one side of the chamber body assembly 106, while one or more upper chamber exhaust passage openings 424 are disposed on an opposite side of the chamber body assembly 106. Each of the one or more upper chamber exhaust passage openings 424 are aligned with an indent 530 formed in the inner surface of the inject ring 116. The alignment of each of the one or more indents 530 and the upper chamber exhaust passage openings 424 enables gas which is injected by the one or more gas injectors 108 to flow across the process volume 110 (FIG. 1) and over the substrate 150 before being removed from the process volume 110 via the upper chamber exhaust passage openings 424. The indents 530 assist in collecting the exhaust gases and directing the exhaust gases downward from an area even with the inject ring 116 towards the upper chamber exhaust passage openings 424. Once the exhaust gas enters the upper chamber exhaust passage openings 424, the exhaust gas flows through one or more upper chamber exhaust passages 426 and out an exhaust outlet 430.

The combination of the indents 530 and the upper chamber exhaust passage openings 424 reduces the complexity of manufacturing the base ring 114 and/or the inject ring 116. The combination of the indents 530 and the upper chamber exhaust passage openings 424 further enables process gas to flow horizontally across the process volume 110 and remain in the upper chamber 111 without diverting downward into the lower chamber 113 where it may become a source of contamination.

Figure 4B:
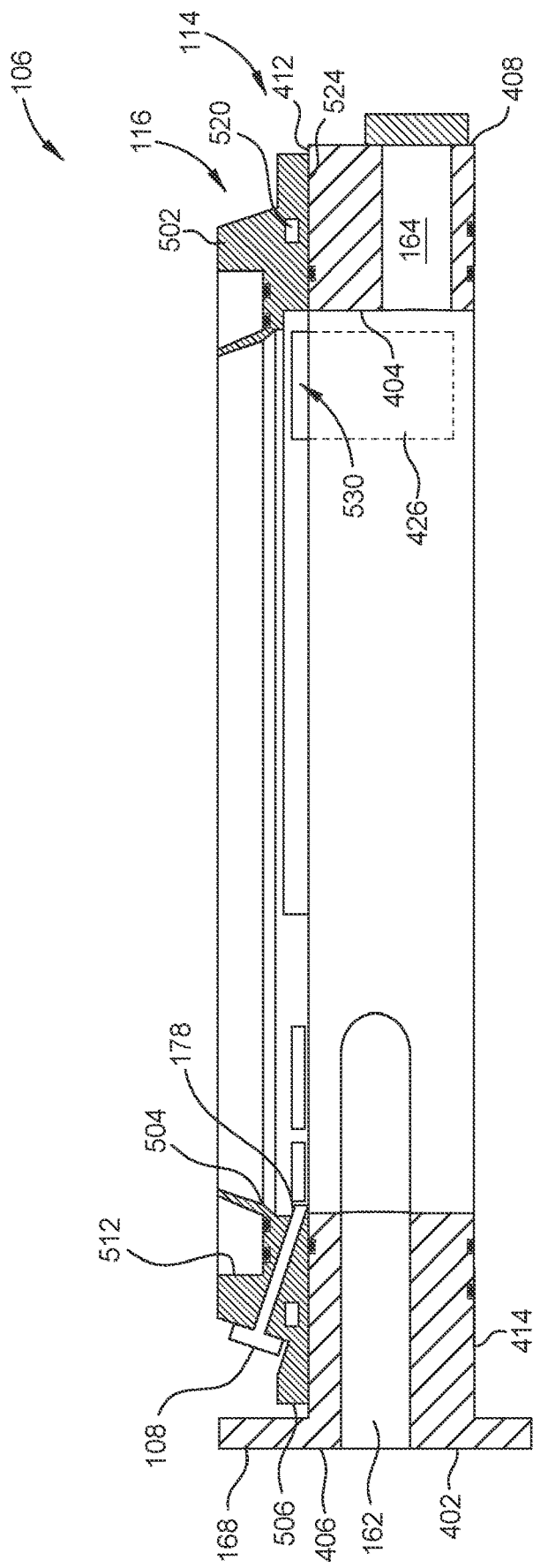
FIG. 4B is a schematic cross sectional view of the chamber body assembly of FIG. 4A taken through another plane, according to embodiments of the present disclosure.

FIG. 4B is a schematic cross sectional view of the chamber body assembly 106 of FIG. 4A taken through another plane, according to embodiments of the present disclosure. The cross section shown in FIG. 4B illustrates the lower chamber exhaust passage 164 and the relationship between the orientation of the lower chamber exhaust passage 164 and at least one of the upper chamber exhaust passage openings 424, the indent 530, and the upper chamber exhaust passage 426. The indent 530, the upper chamber exhaust passage opening 424, and the upper chamber exhaust passage 426 are disposed at an angle to the lower chamber exhaust passage 164 as described with reference to FIGS. 4D, 4E, and 5B. The indents 530 and the upper chamber exhaust passage openings 424 are additionally disposed above the lower chamber exhaust passage 164. The lower chamber exhaust passage 164 is configured to remove exhaust gases from the lower chamber 113, while the upper chamber exhaust passage openings 424 are configured to remove exhaust gases from the upper chamber 111.

Figure 4C:
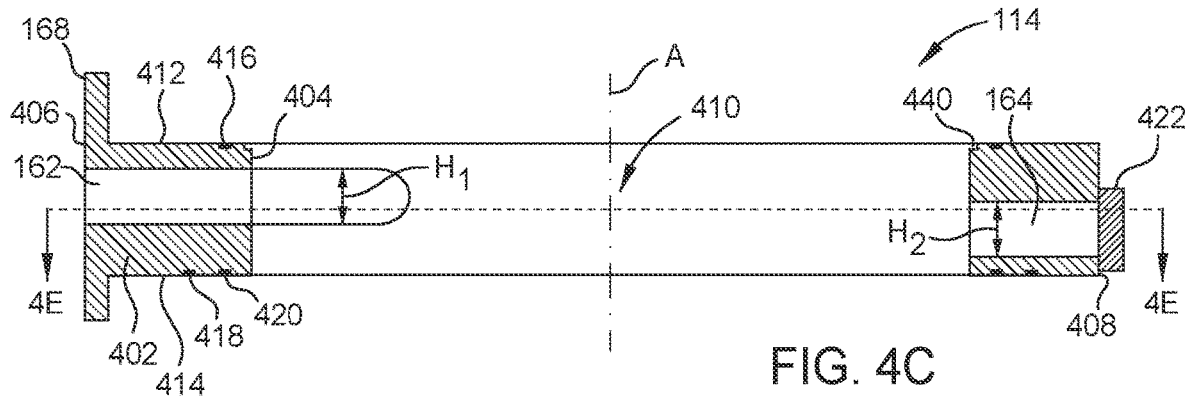
FIG. 4C is a schematic cross sectional view of a base ring, according to embodiments of the present disclosure.

FIG. 4C is a schematic cross sectional view of the base ring 114. The base ring 114 includes a base ring body 402 with an opening 410 disposed therethrough. The opening 410 forms at least part of the process volume 110 of the overall process chamber 100. The opening 410 is sized to allow the substrate and the susceptor assembly 124 to be disposed therein. The opening 410 is formed by the inner wall 404 of the base ring 114. The opening 410 extends from the top surface 412 of the base ring 114 to a bottom surface 414 of the base ring 114.

The base ring body 402 is the body of the base ring 114 and is formed of a metal material, such as steel, aluminum, copper, nickel, or a metal alloy. In some embodiments, the base ring body 402 may be a silicon carbide material or a doped silicon carbide material.

Figure 4D:
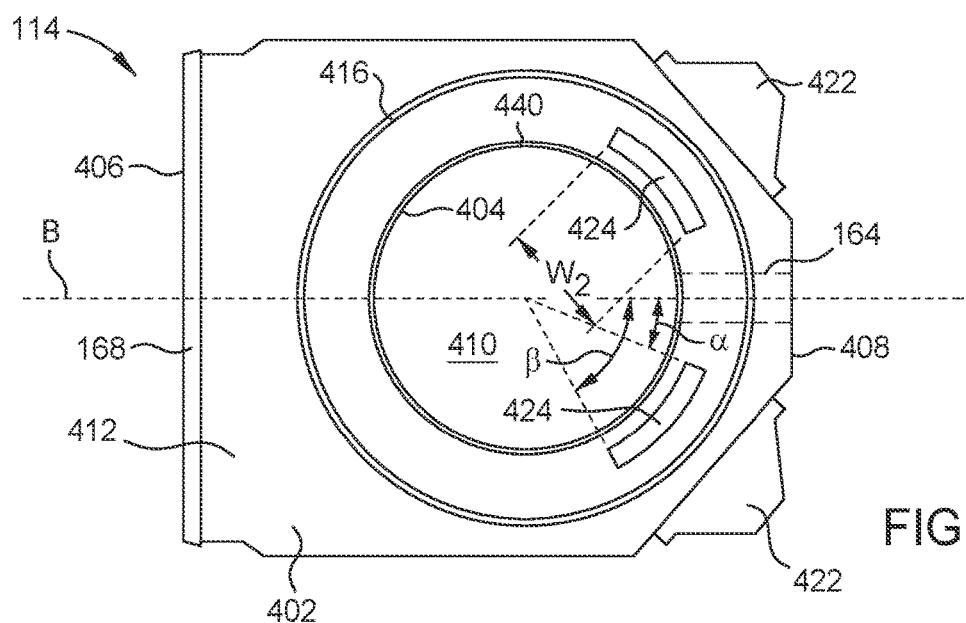
FIG. 4D is a schematic plan view of the base ring of FIG. 4C, according to embodiments of the present disclosure.

As described above, the substrate transfer passage 162 is disposed opposite the one or more upper chamber exhaust passage openings 424 and the lower chamber exhaust passage 164. The substrate transfer passage 162 is disposed through a first side 406 of the base ring 114, while the one or more upper chamber exhaust passage openings 424 and the lower chamber exhaust passage 164 are formed through a second side 408 of the base ring 114. The first side 406 of the base ring 114 is disposed on one side of a plane C (FIG. 4E) disposed through the base ring 114, while the second side 408 of the base ring 114 is disposed on an opposite side of the plane C from the first side 406. The plane C passes through the central axis A and is perpendicular to the plane B. The plane C separates the substrate transfer passage 162 from the lower chamber exhaust passage 164 and the upper chamber exhaust passage openings 424. In the embodiment described herein, there are two upper chamber exhaust passage openings 424 are formed through the top surface 412 of the base ring 114 (FIG. 4D). The two upper chamber exhaust passage openings 424 are opposite the substrate transfer passage 162, but offset from being directly across from the substrate transfer passage 162. The two upper chamber exhaust passage openings 424 are offset to prevent the inward convergence of gas as it flows across the process volume 110 from the gas injectors 108 (FIG. 1). The gas flow instead remains more evenly distributed across the process volume and enables more uniform deposition on the substrate 150. The two upper chamber exhaust passage openings 424 are disposed inward of a sealing groove 416.

The substrate transfer passage 162 has a height $H_1$ of about 7 mm to about 30 mm, such as about 10 mm to about 20 mm to enable the substrate 150 and a transfer arm (not shown) to be disposed therethrough. The substrate transfer passage 162 further has a width $W_1$ (FIG. 4E) of about 305 mm to about 350 mm, such as about 305 mm to about 315 mm. The width $W_1$ enables substrates 150 to pass therethrough and be placed on the susceptor assembly 124.

Figure 10A:
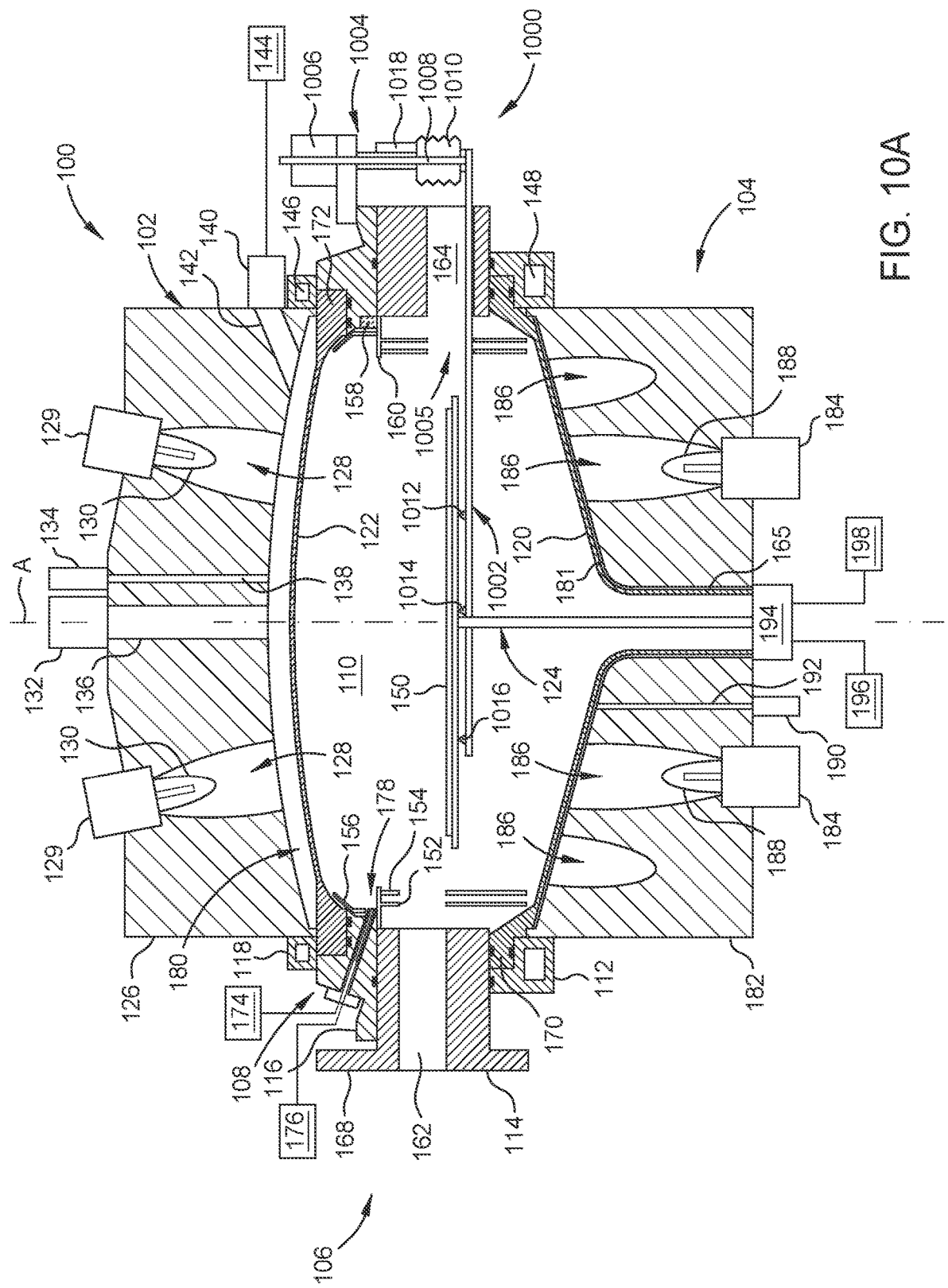
FIG. 10A is another schematic cross sectional view of the deposition chamber of FIG. 1 illustrating a lift arm assembly, according to embodiments of the present disclosure.

Referring additionally to FIG. 1, the lower chamber exhaust passage 164 is disposed across from the substrate transfer passage 162 to put the lower chamber exhaust passage 164 in fluid communication with an exhaust pump (not shown). The exhaust pump may also be coupled to and in fluid communication with both of the upper chamber exhaust passage openings 424. As described herein, the lower chamber exhaust passage 164 is a cylindrical passage or an elliptic passage. The lower chamber exhaust passage 164 has a height $H_2$ of about 0 mm to about 75 mm, such as about 25 mm to about 50 mm. The height $H_2$ of the lower chamber exhaust passage 164 is configured to allow adequate lower chamber gas flow to pass therethrough along with a potential lift arm assembly as shown in FIG. 10A.

Continuing to refer to FIG. 4C, the top surface 412 of the base ring body 402 includes a sealing groove 416 disposed therein. The sealing groove 416 circumscribes the inner wall 404 and is configured to receive a sealing ring, such as an o-ring or other sealing gasket. The sealing ring disposed within the sealing groove 416 may be a polymer or plastic with a hardness of greater than 50 durometer, such as greater than 60 durometer, such as greater than about 65 durometer on the Shore A scale. The sealing groove 416 is sized to receive the sealing ring which forms a seal between the base ring 114 and the inject ring 116, as shown in FIG. 1. The sealing groove 416 is disposed radially outward of the upper chamber exhaust passage openings 424 to prevent exhaust gases flowing through the upper chamber exhaust passage openings 424 from escaping from the process chamber 100.

The top surface 412 optionally includes a support step 440. The support step 440 is a recess formed between the top surface 412 and the inner wall 404. The support step 440 is configured to support the flange 160 (FIG. 1). The flange 160 is configured to be disposed at least partially within the support step 440 of the base ring 114 and the inject ring 116 to hold the flange 160 in place.

The bottom surface 414 of the base ring body 402 includes a first sealing groove 418 and a second sealing groove 420. The first sealing groove 418 and the second sealing groove 420 are concentric and circumscribe the inner wall 404 along the bottom surface 414. The first sealing groove 418 is disposed further outward from the axis A than the second sealing groove 420, such that the first sealing groove 418 circumscribes the second sealing groove 420. Each of the first sealing groove 418 and the second sealing groove 420 are configured to receive a sealing ring, such as an o-ring or other sealing gasket. The sealing ring disposed within the first sealing groove 418 and the second sealing groove 420 may be a polymer or plastic with a hardness of greater than 50 durometer, such as greater than 60 durometer, such as greater than about 65 durometer on the Shore A scale. The first sealing groove 418 and the second sealing groove 420 are sized to receive the sealing ring and enable a seal to be formed between the base ring 114 and the peripheral supports 170 of the lower window 120 as shown in FIG. 1.

Figure 4E:
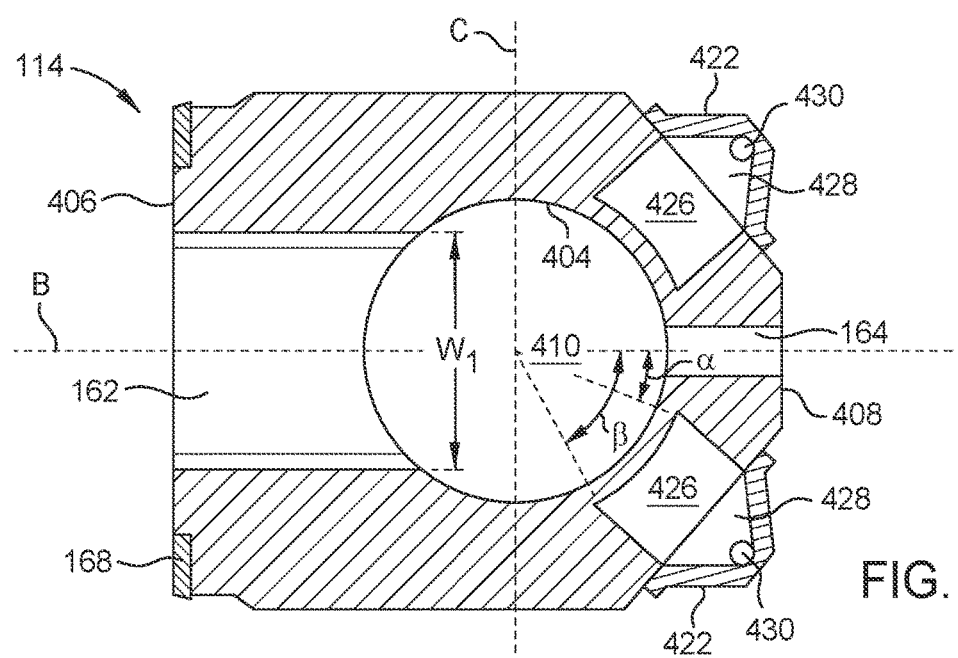
FIG. 4E is a schematic cross sectional view of the base ring taken through section line 4E-4E of FIG. 4C, according to embodiments of the present disclosure.

FIG. 4D is a schematic plan view of the base ring 114 of FIG. 4C. As shown in FIG. 4D, the top surface 412 includes one or more upper chamber exhaust passage openings 424 disposed therethrough. The one or more upper chamber exhaust passage openings 424 are disposed between the inner wall 404 and the sealing groove 416. The one or more upper chamber exhaust passage openings 424 are in fluid communication with a portion of the upper liner 156 and the inject ring 116 to remove process gases from an upper portion of the process volume 110. Each of the one or more upper chamber exhaust passage openings 424 are each in fluid communication with an exhaust module 422 via an upper chamber exhaust passage 426. The upper chamber exhaust passage 426 is a passage disposed through the base ring body 402 (FIG. 4E). The upper chamber exhaust passage 426 fluidly couples one of the exhaust modules 422 to one of the upper chamber exhaust passage openings 424. As shown in FIG. 4D there are two exhaust modules 422 attached to the second side 408 of the base ring body 402. Each of the two exhaust modules 422 are disposed on opposite sides of the lower chamber exhaust passage 164, such that each of the exhaust modules 422 are disposed on opposite sides of and mirrored over a plane B. The plane B passes through the central axis A, the center of the substrate transfer passage 162, and the lower chamber exhaust passage 164 (FIG. 4E). The plane B is a vertically oriented plane and divides the base ring 114 in half, such that the base ring 114 is mirrored across the plane B. The same plane B is utilized with reference to the inject ring as shown in FIG. 5B.

The one or more upper chamber exhaust passage openings 424 each have a width $W_2$ of about 10 mm to about 220 mm, such as about 20 mm to about 150 mm. The width $W_2$ of each of the upper chamber exhaust passage openings 424 enables exhaust gases from within the process volume 110 to be removed while reducing the turbulence of the gas flow within the process volume 110.

Each of the upper chamber exhaust passage openings 424 are disposed between a first exhaust angle α and a second exhaust angle β with respect to the plane B. The first exhaust angle α is an angle of about 5 degrees to about 45 degrees with respect to the plane B, such as about 10 degrees to about 30 degrees with respect to the plane B, such as about 10 degrees to about 25 degrees with respect to the plane B. The first exhaust angle α is large enough to prevent the upper chamber exhaust passage 426 from intersecting the lower chamber exhaust passage 164.

The second exhaust angle β is an angle of about 30 degrees to about 70 degrees, such as about 35 degrees to about 65 degrees, such as about 45 degrees to about 60 degrees. The second exhaust angle β is great enough to capture gas directed across the opening 410 by one or more gas injectors 108 without substantial curvature of the gas paths inward towards the plane B. The difference between the first exhaust angle α and the second exhaust angle β is about 25 degrees to about 60 degrees, such as about 30 degrees to about 50 degrees. The different between the first exhaust angle α and the second exhaust angle β enables the upper chamber exhaust passage openings 424 to be disposed around a desired circumference of the opening 410, such that the difference is the amount of the base ring 114 around which the upper chamber exhaust passage openings 424 extend.

FIG. 4E is a schematic cross sectional plan view of the base ring 114 of FIG. 4C through section line 4E-4E. As shown in FIG. 4E, each of the upper chamber exhaust passages 426 fluidly connect to an exhaust module passage 428 disposed through each of the exhaust modules 422. The exhaust module passage 428 is in fluid communication with the upper chamber exhaust passage opening 424 via the upper chamber exhaust passage 426. The exhaust module passage 428 narrows as the exhaust module passage 428 extends further from the base ring body 402 until the exhaust module passage 428 is exposed to an exhaust outlet 430. The exhaust outlet 430 is an opening formed through a wall of the exhaust module passage 428 and configured to be coupled to an exhaust conduit (not shown) for removal of the exhaust gas from the process chamber 100. Similarly to the upper chamber exhaust passage openings 424, the upper chamber exhaust passages 426 are disposed between the first exhaust angle α and the second exhaust angle β with respect to the plane B.

FIG. 5A is a schematic cross sectional view of the inject ring 116, according to embodiments of the present disclosure. The inject ring 116 is configured to sit on top of the base ring 114 and provide process gases to the process volume 110. The inject ring 116 is a separate component from the base ring 114. The inject ring 116 is configured to inject gas across the surface of a substrate, such that the predominant flow of gas through the process volume 110 is in a horizontal direction. The separable inject ring 116 enables the inject ring 116 to be easily replaced and maintained without replacing or removing the entirety of the chamber body assembly 106. This reduces replacement costs and allows for new gas injection improvements to be more easily implemented with the process chamber 100 with minimal impact to other chamber components.

The injection ring 116 includes an inner surface 504 and an outer surface 506. The inner surface 504 forms a ring around an opening 510 disposed within the inject ring 116. The opening 510 forms at least part of the process volume 110 of the process chamber 100. The inject ring 116 includes one or more gas injectors 108 disposed therethrough. The one or more gas injectors 108 extend through an inject ring body 502 from an injector support surface 514 and to the inner surface 504. The one or more gas injectors 108 as described herein are disposed through one or more injector passages 508. Each of the injector passages 508 are sized to receive one of the one or more gas injectors 108, such as one of the gas injectors 108. The injector passages 508 extend from the injector support surface 514 to the inner surface 504. The injector passages 508 extend downward as the injector passages 508 move from the injector support surface 514 to the inner surface 504. Extending downward is defined as the injector passages 508 being disposed further away from a top surface 518 of the inject ring 116 and closer to a bottom surface 524 of the inject ring 116 as the injector passages 508 move radially inward towards the inner surface 504.

The inner surface 504 includes a groove 536 disposed around a majority of the circumference of the inner surface 504, such as greater than 50% of the circumference of the inner surface 504, such as greater 60% of the circumference of the inner surface 504, such as greater than 70% of the circumference of the inner surface 504. The groove 536 is configured to receive a heating element, such as the upper heating element 158. The groove 536 is shown in FIG. 5A as being formed as part of the inner surface 504 and the bottom surface 524 of the inject ring 116. The inner surface 504 also includes two indents 530 disposed therein. The two indents 530 are disposed opposite the injector passages 508. The indents 530 are disposed within the groove 536 and extend deeper into the inject ring body 502 than the groove 536, such that the indents 530 extend further from the axis A than the groove 536.

The injector support surface 514 is a portion of the outer surface 506 of the inject ring body 502 along with an outer stepped surface 516. The injector support surface 514 is configured to hold the one or more gas injectors 108 in place by providing a surface to anchor a portion of the one or more gas injectors 108. The one or more gas outlets 178 are disposed through the inner surface 504 and angled downward towards a substrate 150 disposed within the process volume 110 (FIG. 1).

The bottom surface 524 of the inject ring 116 is configured to contact the top surface 412 of the base ring 114. The bottom surface 524 is a planar surface extending between the outer surface 506 and the inner surface 504. The outer stepped surface 516 extends from the outermost portion of the outer surface 506 to a bottom distal end of the injector support surface 514. The injector support surface 506 extends from the outer stepped surface 516 away from the bottom surface 524. The injector support surface 514 is disposed at an angle to the bottom surface 524. The angle of the injector support surface 514 is at least partially dependent upon the desired downward angle of the injector passages 508 and the one or more gas injectors 108. In embodiments described herein, the angle of the injector support surface 514 with respect to the bottom surface 524 is greater than about 45 degrees, such as about 45 degrees to about 85 degrees, such as about 60 degrees to about 80 degrees, such as about 70 degrees to about 80 degrees. The injector support surface 514 extends radially inward from the outer stepped surface 516, such that the distal end of the injector support surface 514 furthest from the outer stepped surface 516 is closer to the inner surface 504.

The top surface 518 of the inject ring 116 extends radially inward from the upper distal end of the injector support surface 514. The top surface 518 is a horizontal surface, such that the top surface 518 extends parallel to the bottom surface 524. The opposite distal end of the top surface 518 from the injector support surface 514 is attached to a window support trench 512. The window support trench 512 is a channel disposed along the upper surface of the inject ring 116. The window support trench 512 is configured to accept a peripheral support 172 of the upper window 122 therein. The window support trench 512 includes a first window sealing groove 520 and a second window sealing groove 522. Each of the first window sealing groove 520 and the second window sealing groove 522 are configured to receive a sealing ring, such as an o-ring or other sealing gasket. The sealing rings disposed within the first window sealing groove 520 and the second window sealing groove 522 may be a polymer or plastic with a hardness of greater than 50 durometer, such as greater than 60 durometer, such as greater than about 65 durometer on the Shore A scale. The first window sealing groove 520 and the second window sealing groove 522 are sized to receive the sealing ring and enable a seal to be formed between the inject ring 116 and the upper window 122 as shown in FIG. 1.

The inner portion of the window support trench 512 is formed by an angled protrusion 511. The angled protrusion 511 is disposed inward of the first window sealing groove 520 and the second window sealing groove 522. The angled protrusion 511 extends upward from the window support trench 512 and away from the bottom surface 508. The angled protrusion 511 forms a portion of the window support trench 512 disposed on the innermost side of the angled protrusion 511 and a portion of the inner surface 504 on the outermost side of the angled protrusion 511. The angled protrusion 511 extends radially inward while extending upward from the window support trench 512. The angled protrusion 511 shields a portion of the upper window 122, such as the peripheral support 172, from the process volume 110 (FIG. 1). Shielding the peripheral support 172 from the process volume 110 reduces the heating load on the peripheral support 172 and the seals within the first window sealing groove 520 and the second window sealing groove 522. The angled protrusion 511 additionally protects sealing rings disposed within the support trench 512 from being directly exposed to radiant energy or process gases, thus extending the lift and reliability of the sealing rings.

A coolant passage 521 is optionally disposed through the inject ring body 502. The coolant passage 521 is configured to receive a coolant fluid, such as water or oil. The coolant passage 521 is a partial ring disposed through the inject ring body 502 and assists in controlling the temperature of both the inject ring 116 and the base ring 114.

FIG. 5B is a schematic plan view of the inject ring 116 of FIG. 5A having a plurality of gas injectors 108. Five gas injectors 108 are illustrated in FIG. 5B. Other quantities of gas injectors 108 are also envisioned, such as three or more gas injectors 108, four or more gas injectors 108, five or more gas injectors 108, or six or more gas injectors 108. The number of gas injectors 108 determines the number of zones in which the process gases are injected into the process volume 110 (FIG. 1). The group of gas injectors 108 are centered about the plane B. The plane B is the same plane B which passes through the base ring 114. The plane B is disposed through the central axis A and is perpendicular to a plane D. Each of the gas injectors 108 may have a plurality of individual process gas passages disposed therein (not shown). In embodiments wherein five gas injectors 108 are utilized, a central gas injector 532a forms an inner gas inject zone, two outermost gas injectors 532c form an outer gas inject zone, and two intermediate gas injectors 532b between the central gas injector 532a and the outermost gas injectors 532c form an intermediate gas inject zone. The plane B is disposed through the central gas injector 532a. The two intermediate gas injectors 532b are mirrored across the plane B. Similarly, the two outermost gas injectors 532c are mirrored across the plane B. Each of the injector passages 508 have a gas injector 108 disposed therethrough. The number of injector passages 508 is equal to the number of gas injectors 108.

Each of the injector passages 508 have an injector passage width $W_3$. The injector passage width $W_3$ of each of the injector passages 508 is shown as being the same. In alternative embodiments, the injector passage width $W_3$ varies as the injector passages 508 extend outward from a central gas injector 532a to the outermost gas injectors 532c. In some embodiments, the injector passage width $W_3$ of the injector passages 508 through which the outermost gas injectors 532c extend is greater than the injector passage width $W_3$ of the injector passages 508 through which the intermediate gas injectors 532b extend. The injector passages 508 through which the intermediate gas injectors 532b extend has a greater inject passage width $W_3$ than the injector passage width $W_3$ of the injector passage 508 through which the central gas injector 532a extends.

Alternatively, the injector passage widths $W_3$ are reduced as the injector passages 508 extend outward from the injector passage 508 through which the central gas injector 532a is disposed. In this embodiment, the injector passage width $W_3$ of the injector passages 508 through which the outermost gas injectors 532c extend is less than the injector passage width $W_3$ of the injector passages 508 through which the intermediate gas injectors 532b extend. The inject passage width $W_3$ of the injector passages 508 through which the intermediate gas injectors 532b extend is less than the injector passage width $W_3$ of the injector passage 508 through which the central gas injector 532a extends.

Each of the injector passages 508 are disposed at an injector angle γ with respect to the plane B. The injector angle γ is taken with respect to the plane B, but on the opposite side of the plane D with respect to the first exhaust angle α and the second exhaust angle β. The injector angle γ is less than about 70 degrees from the plane B, such as less than about 65 degrees from the plane B, such as less than about 60 degrees from the plane B. The injector angle γ is configured to be within 10 degrees of the second exhaust angle β, such that the difference between the injector angle γ and the second exhaust angle β is about −10 degrees to about 10 degrees, such as about −5 degrees to about 5 degrees, such as about 0 degrees. The injector angle γ and the second exhaust angle β are similar to reduce deflection of gases injected into the process volume 110 by the gas injectors 108 as the gases are exhausted. Deflecting the gases may cause non-uniformities in film deposition.

The inject ring 116 includes indents 530 within the inner surface 504 opposite the injector passages 508. The indents 530 correspond to the one or more upper chamber exhaust passage openings 424 (FIG. 4D). The indents 530 are disposed over the one or more upper chamber exhaust passage openings 424, such that the indents 530 serve as a first portion of the one or more upper chamber exhaust passages 426 of the base ring 114 (FIG. 4A). In the embodiment described herein, there are two indents 530 which correspond to two upper chamber exhaust passages 426. The two indents 530 are disposed on an opposite side of the opening 510 from the injector passages 508. The two indents 530 are disposed on one side of the plane D which passes through the inject ring 116, while the injector passages 508 are disposed on the opposite side of the plane D. The two indents 530 are offset from the center of the inject ring 116 across from the injector passage 508 through which the central gas injector 532a is disposed. Neither of the indents 530 are disposed through the plane B. The indents 530 are mirrored across the plane B. As described above, offsetting the two indents 530 prevents the inward convergence of gas as it flows across the process volume 110 from the gas injectors 108 (FIG. 1) and to the upper chamber exhaust passages 426.

As described herein, the indents 530 are similar in size and shape to the one or more upper chamber exhaust passage openings 424. Each of the indents 530 have a width $W_4$ of about 0 mm to about 220 mm, such as about 10 mm to about 150 mm. The width $W_4$ corresponds to the width $W_2$ of the upper chamber exhaust passage openings 424 (FIG. 4D). The width $W_4$ is configured to reduce the disruption of gas flow within the process volume 110 to allow for primarily laminar gas flow and uniform deposition on the substrate 150. Similarly to the upper chamber exhaust passage openings 424, the indents 530 are disposed between the first exhaust angle α and the second exhaust angle β with respect to the plane B.

The inject ring body 502 forms the inject ring 116 and is formed of a metal material, such as steel, aluminum, copper, nickel, or metal alloy. In some embodiments, the inject ring body 502 may be fabricated from a silicon carbide material or a doped silicon carbide material.

Figure 6A:
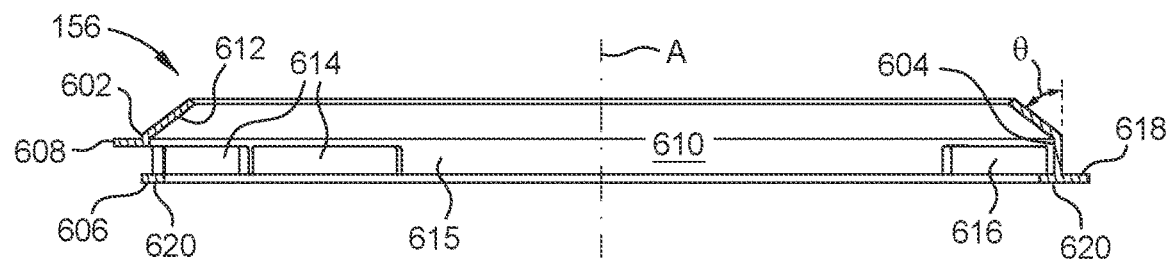
FIG. 6A is a schematic cross sectional view of an upper liner, according to embodiments of the present disclosure.

FIG. 6A is a schematic cross sectional view of an upper liner 156 for use within the process chamber 100 of FIG. 1. The upper liner 156 is configured to be placed inside of the opening 510 of the inject ring 116 (FIG. 5A). The upper liner 156 is ring shaped. The upper liner 156 is configured to separate the inner surface 504 of the inject ring 116 from the process volume 110. The upper liner 156 serves to shield the inner surface 504 of the inject ring 116 from process gases within the process volume 110 and further protects the process volume 110 from particles or other contaminants released by the inject ring 116 and the upper heater 158.

The upper liner 156 includes an outer surface 602 and an inner surface 604. The inner surface 604 forms an opening 610 disposed through the upper liner 156. The opening 610 is configured to allow the substrate 150 to be disposed therein during process operations. The opening 610 forms at least part of the process volume 110. While disposed within the process chamber 100, the inner surface 604 of the upper liner 156 is centered about the axis A.

One or more liner inject openings 614 are disposed through the upper liner 156. The one or more liner inject openings 614 are disposed from the outer surface 602 to the inner surface 604. The one or more liner inject openings 614 are configured to align with the injector passages 508 of the inject ring 116 (FIG. 5B) along one side of the upper liner 156. The liner inject openings 614 are disposed on a first side of a plane E. The plane E is perpendicular to the plane B and passes through the central axis A. The plane E is aligned with the plane C and the plane D when each of the inject ring 116, the base ring 114, and the upper liner 156 are disposed within the process chamber 100. In embodiments described herein, there are five liner inject openings 614. Each of the liner inject openings 614 are configured to fit around a portion of a gas injector 108 which protrudes outward from the inner surface of the inject ring 116. Other quantities of liner inject openings 614 are also envisioned, such as three or more liner inject openings 614, four or more liner inject openings 614, five or more liner inject openings 614, or six or more liner inject openings 614. The number of liner inject openings 614 determines the number of zones in which the process gases are injected into the process volume 110 (FIG. 1). The number of liner inject openings 614 is the same as the number of injector passages 508. Similarly to the injector passages 508, the liner inject openings 614 are mirrored across the plane B. The liner inject openings 614 fit tightly around an end of each of the gas injectors 108. The tight fit around the gas injectors 108 reduces the leakage of process gases from the process volume 110 to the area surrounding the outer surface 602.

Figure 6B:
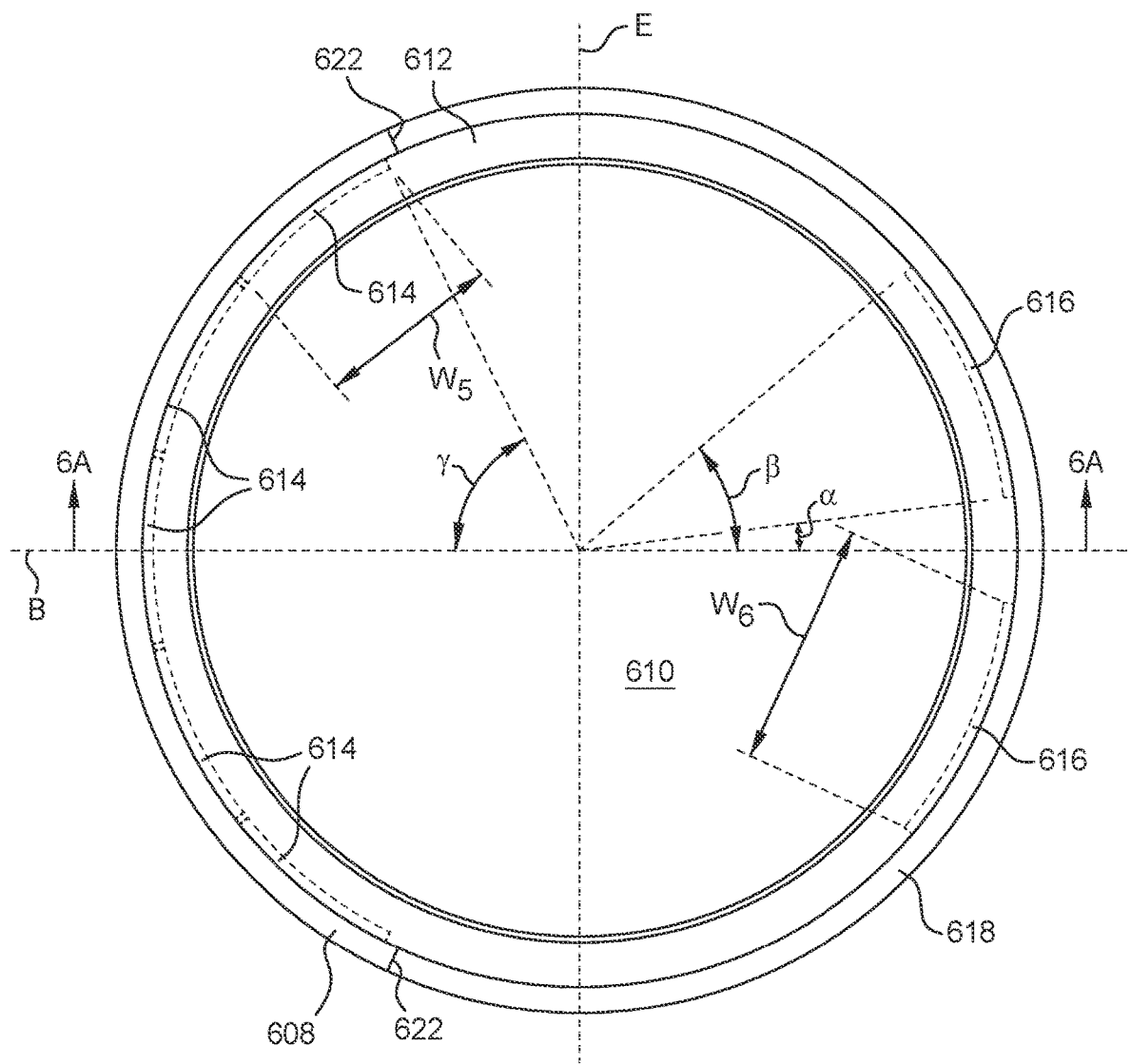
FIG. 6B is a schematic plan view of the upper liner of FIG. 6A, according to embodiments of the present disclosure.

Opposite the liner inject openings 614 are one or more liner exhaust openings 616. The one or more liner exhaust openings 616 are on the opposite side of the plane E from the liner inject openings 614. The one or more liner exhaust openings 616 are disposed from the outer surface 602 to the inner surface 604. The one or more liner exhaust openings 616 are configured to align with the indents 530 of the inject ring 116. The one or more liner exhaust openings 616 are elongated openings and extend around a portion of the circumference of the upper liner 156. The one or more liner exhaust openings 616 include two liner exhaust openings 616 as shown in FIG. 6B, such that there are two liner exhaust openings 616. Similarly to the indents 530, each of the two liner exhaust openings 616 are disposed on opposite sides of the plane B from one another.

Both the one or more liner inject openings 614 and the one or more liner exhaust openings 616 are disposed on a central liner ring 615. At least the central liner ring 615 is centered about the axis A while the upper liner 156 is disposed within the process chamber 100. The central liner ring 615 is disposed between a liner support ring 606 and an upper outward extending surface 608.

The liner support ring 606 forms the bottom surface 620 of the upper liner 156. The liner support ring 606 is a ring attached to the lower distal end of the central liner ring 615. The liner support ring 606 is a horizontally oriented ring and the bottom surface 620 is a horizontally oriented surface. The width of the liner support ring 606 varies across the circumference of the liner support ring 606. The liner support ring 606 extends radially inward from the inner surface 604 of the central liner ring 615 around the entire circumference of the liner support ring 606. The liner support ring 606 widens along the side of the upper liner 156 adjacent to the liner exhaust openings 616 to include a lower outward extending portion 618. The lower outward extending portion 618 extends outward from a portion of the outer surface 602 corresponding to the central liner ring 615.

The lower outward extending portion 618 serves to assist in supporting the upper liner 156 and assists in aligning the upper liner 156 with the lower liner 154. As the lower outward extending portion 618 only extends around a portion of the liner support ring 606, the lower outward extending portion 618 enables the upper liner 156 to be fit within a groove which supports the upper liner 156. The lower outward extending portion 618 is not disposed around the portion of the liner support ring 606 disposed directly below any of the liner inject openings 614. Not extending around the liner support ring 606 which corresponds to the liner inject openings 614 enables the upper liner 156 to be more easily placed into and fitted around each of the one or more gas injectors 108.

On portions of the circumference for which the lower outward extending portion 618 is not present, the upper outward extending surface 608 extends radially outward from a top distal end of the central liner ring 615 to a position adjacent to the inner surface 504 of the inject ring 116. In embodiment described herein, the upper outward extending surface 608 extends a similar radial distance outward from the central liner ring 615 as the lower outward extending portion 618. The upper outward extending portion 608 may further serve to support the upper liner 156. The upper outward extending portion 608 is disposed above the liner inject openings 614. The lower outward extending portion 618 and the upper outward extending portion 608 are connected by a connection surface 622 (FIG. 6B). The connection surface 622 is a surface extending outward from the central liner ring 615 and coupling the upper outward extending portion 608 and the lower outward extending portion 618 to form a continuous outward extending portion. The continuous outward extending portion extends around the full circumference of the upper liner 156. The connection surface 622 extends a similar outer radial distance from the central liner ring 615 as both the lower outward extending portion 618 and the upper outward extending surface 608. In embodiments described herein, the connection surface 622 is a vertical surface, but it is envisioned the connection surface 622 may also be disposed at an angle to a horizontal other than 90 degrees.

A liner flange 612 is disposed on top of the central liner ring 615. The liner flange 615 is angled with respect to the central liner ring 615. The liner flange 612 is disposed at an upper distal end of the central liner ring 615 and extends radially inward of the inner surface 604 of the central liner ring 615. The liner flange 612 extends upward and away from the bottom surface 620. The liner flange 612 is disposed at an angle θ with respect to a plane passing through the vertical inner surface 604 and/or the vertical outer surface 602 of the central liner ring 615. The angle θ is about 15 degrees to about 75 degrees, such as about 30 degrees to about 60 degrees. The liner flange 612 is meant to correspond with the angled protrusion 511 of the inject ring 116. The liner flange 612 separates the angled protrusion 511 from the process volume 110.

FIG. 6B is a schematic plan view of the upper liner 156 of FIG. 6A. As shown, the upper liner 156 includes five liner inject openings 614. Other quantities of liner inject openings 614 are also envisioned, such as three or more liner inject openings 614, four or more liner inject openings 614, five or more liner inject openings 614, or six or more liner inject openings 614. The liner inject openings 614 are disposed in a manner similar to the injector passage 508 of FIGS. 5A-5B. Two liner exhaust openings 616 are disposed opposite the liner inject openings 614 and offset from the direct center of the liner inject openings 614. Each of the liner exhaust openings 616 is configured to align with the indents 530, such that the liner exhaust openings 616 are disposed adjacent a similar portion of the circumference of the inject ring 116 as the indents 530. Similarly to the indents 530, the liner exhaust openings 616 are disposed between the first exhaust angle α and the second exhaust angle β with respect to the plane B. The liner inject openings 614 are disposed at an injector angle γ with respect to the plane B in a similar manner as the injector passages 508.

Each of the liner inject openings 614 have a width $W_5$ of about 10 mm to about 100 mm, such as about 50 mm to about 80 mm. The width $W_5$ is selected to allow a portion of the gas injectors 108 to be disposed within the liner inject openings 614. Each of the liner exhaust openings 616 have a width $W_6$ of about 0 mm to about 220 mm, such as about 25 mm to about 100 mm. The width $W_6$ and offset of the liner exhaust openings 616 is configured to reduce the disruption of gas flow within the process volume 110. Reducing the disruption of the gas flow promotes a primarily laminar gas flow within the process volume 110 and contributes to uniform deposition on the substrate 150.

Figure 7:
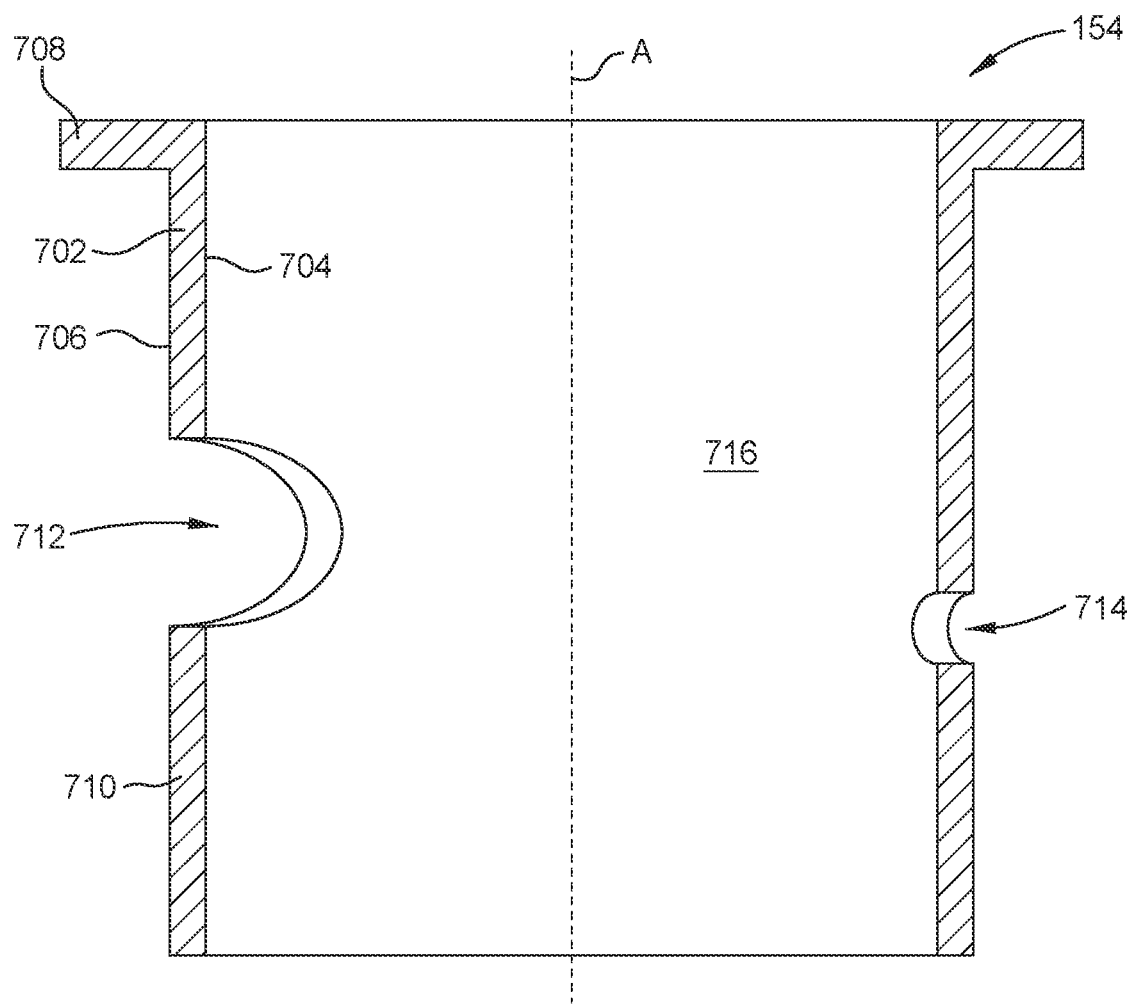
FIG. 7 is a schematic cross sectional view of a lower liner, according to embodiments of the present disclosure.

FIG. 7 is a schematic cross sectional view of the lower liner 154, according to embodiments of the present disclosure. The lower liner 154 is configured to be placed inside of the opening 410 of the base ring 114 (FIG. 5D). The lower liner 154 is ring shaped and has a lower liner body 702. The lower liner 154 is configured to separate the inner surface 404 of the base ring 114 from the process volume 110. The upper liner 156 shields the inner surface 404 of the base ring 114 from process gases within the process volume 110 and further protects the process volume 110 from particles or other contaminants released by the base ring 114 and the lower heater 152.

The lower liner 154 includes an outer surface 706 and an inner surface 704. The inner surface 704 forms an opening 716 disposed through the lower liner 154. The opening 716 is configured to allow a substrate to be disposed therein during process operations. The opening 716 forms at least part of the process volume 110. While disposed within the process chamber 100, the inner surface 704 of the lower liner 154 is centered about the axis A.

The lower liner 154 includes a support flange 708 and a hanging liner portion 710. The hanging liner portion 710 is coupled to the support flange 708 at a top distal end. The hanging liner portion 710 forms a vertical curtain to protect the inner wall 404 of the base ring 114 and the lower heater 152 from process gases within the process volume 110. The hanging liner portion 710 is configured to extend downward parallel to an inner wall 404 of the base ring 114 and radially inwards of the lower heater 152. The support flange 708 extends radially outward from the hanging liner portion 710, such as radially outward and away from the outer surface 706.

The lower liner 154 further includes a liner substrate opening 712. The liner substrate opening 712 corresponds to the substrate transfer passage 162 and is similar in size and shape to the substrate transfer passage 162. The liner substrate opening 712 is aligned with the substrate transfer passage 162, such that a substrate passing through the substrate transfer passage 162 also passes through the liner substrate opening 712. The liner substrate opening 712 extends from the outer surface 706 to the inner surface 704 and through the hanging liner portion 710. The liner substrate opening 712 is similar in size and shape to the substrate transfer passage 162.

A lower exhaust liner opening 714 is disposed opposite the liner substrate opening 712. The lower exhaust liner opening 714 corresponds to the lower chamber exhaust passage 164 (FIG. 1). The lower exhaust liner opening 714 is a circular or an elliptical opening formed from the outer surface 706 to the inner surface 704 and through the hanging liner portion 710. The lower exhaust liner opening 714 is similar in size and shape to the lower chamber exhaust passage 164.

Figure 8A:
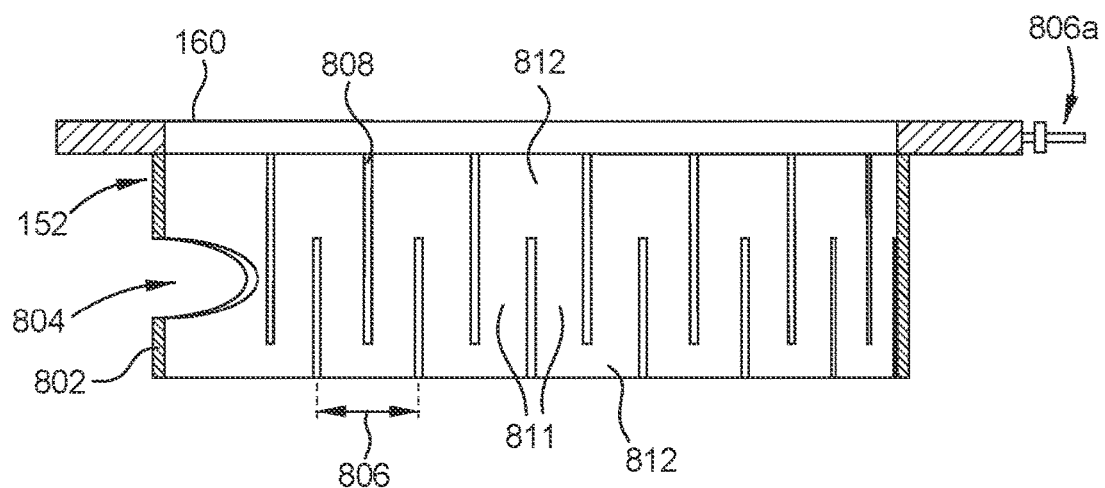
FIG. 8A is schematic cross sectional view of a lower heater, according to embodiments of the present disclosure.

FIG. 8A is schematic cross sectional view of a lower heater 152, according to embodiments of the present disclosure. The lower heater 152 is coupled to the flange 160 and includes a resistive heating element 802. Other types of heaters are also contemplated. The lower heater 152 reduces thermal losses to the walls of the process chamber 100. In particular, the lower heater 152 is configured to compensate for heat losses from the process volume 110 to the inner wall 404 of the base ring 114 (FIG. 4C). Compensating for the heat lost to the inner wall 404 allows the temperature of the process volume 110 to be more easily maintained at a desired temperature.

Figure 8B:
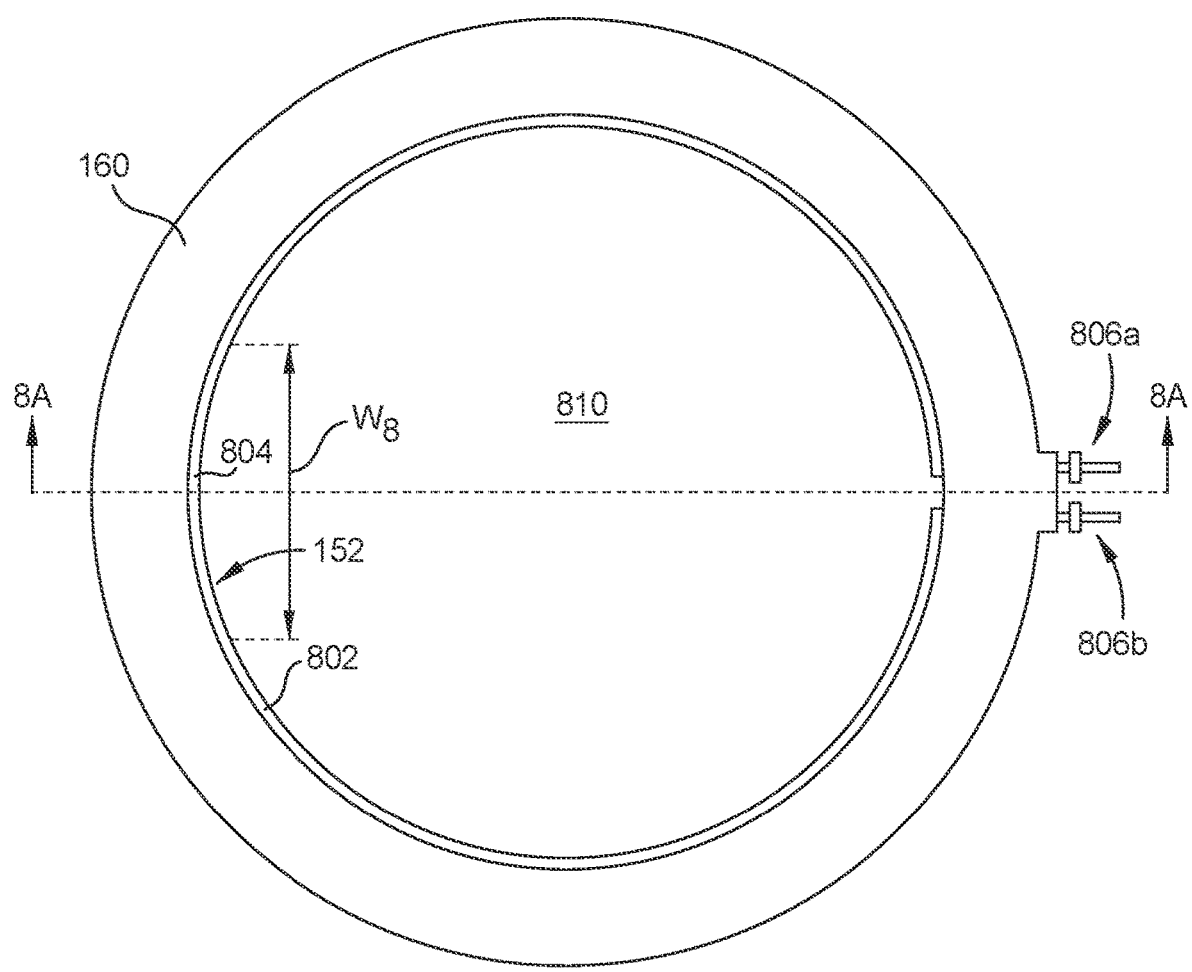
FIG. 8B is a schematic plan view of the lower heater of FIG. 8A, according to embodiments of the present disclosure.

The lower heater 152 includes a substrate passage opening 804 disposed through the resistive heating element 802. The substrate passage opening 804 is configured to align with the substrate transfer passage 162. The substrate passage opening 804 is sized to allow a substrate, such as the substrate 150 of FIG. 1, to pass therethrough. The width $W_8$ of the substrate passage opening 804 is about 305 mm to about 350 mm, such as about 305 mm to about 315 mm (FIG. 8B).

The resistive heating element 802 is disposed in a serpentine arrangement, such that the resistive heating element 802 includes a plurality of turns and bends. The resistive heating element 802 include vertical portions 811 disposed parallel with one another and horizontal portions 812 disposed parallel with one another. Each of the vertical portions 811 are connected to the adjacent vertical portion 811 by one of the horizontal portions 812. Current from a power source (not shown) flows through the coils of the resistive heating element 802 and resistively heats the resistive heating element 802.

The resistive heating element 802 is a carbon based material, such that the resistivity of the coil material is about 500 μΩ·cm to about 1500 μΩ·cm, such as about 750 μΩ·cm to about 1250 μΩ·cm. In some embodiments, the resistive heating element 802 is formed of a graphite material. Other materials which form the resistive heating element 802 may include paralytic graphite and silicon carbide. The paralytic graphite and silicon carbide may include alternative resistivity ranges. Gaps 808 are formed between each of the adjacent vertical portions 811. The gaps 808 enable thermal expansion of the resistive heating element 802 and may also allow purge gases or other gases to pass therethrough. The gaps 808 may be larger along the side of the resistive heating element 802 opposite the substrate passage opening 804 to allow exhaust gases, such as exhaust gasses to pass therethrough. Alternatively, an opening or a break in the resistive heating element 802 is disposed adjacent to the lower chamber exhaust passage 164. The exhaust gasses would pass through the gaps 808 and to the lower chamber exhaust passage 164 (FIG. 1).

The resistive heating element 802 has a curved or hollow cylindrical shape and is disposed between the lower liner 154 and the inner wall 404 of the bare ring 114. The resistive heating element 802 forms at least a partial ring. In embodiments described herein, the resistive heating element 802 fully or partially encircles the process volume 110 and the lower liner 154. Each coil 806 of the resistive heating element 802 includes two vertical portions 811 connected by a horizontal portion 812 at a first distal end of each vertical portion 811 and half of a horizontal portion 812 coupled to the opposite distal end of each of the vertical portions 811. There are a plurality of coils 806 disposed within the resistive heating element 802.

FIG. 8B is a schematic plan view of the lower heater 152 of FIG. 8A. The curvature of the lower heater 152 forms an opening 810 disposed within the lower heater 152. The flange 160 is connected to the top end of the lower heater 152 and extends radially outward from the lower heater 152. The flange 160 may be configured to connect to or rest within a groove or divot of the base body 114 of the inject ring 116. In some embodiments, the flange 160 may extend between the base body 114 and the inject ring 116. The flange 160 has a flat ring shape.

The resistive heating element 802 is electrically coupled to a first electrical connection 806a and a second electrical connection 806b. The first electrical connection 806a and the second electrical connection 806b are located on the flange 160. The first electrical connection 806a and the second electrical connection 806b are configured to be connected to a power source. The first electrical connection 806a and the second electrical connection 806b provide power to the resistive heating element 802 so that the temperature of the lower heater 152 may be controlled.

Figure 9:
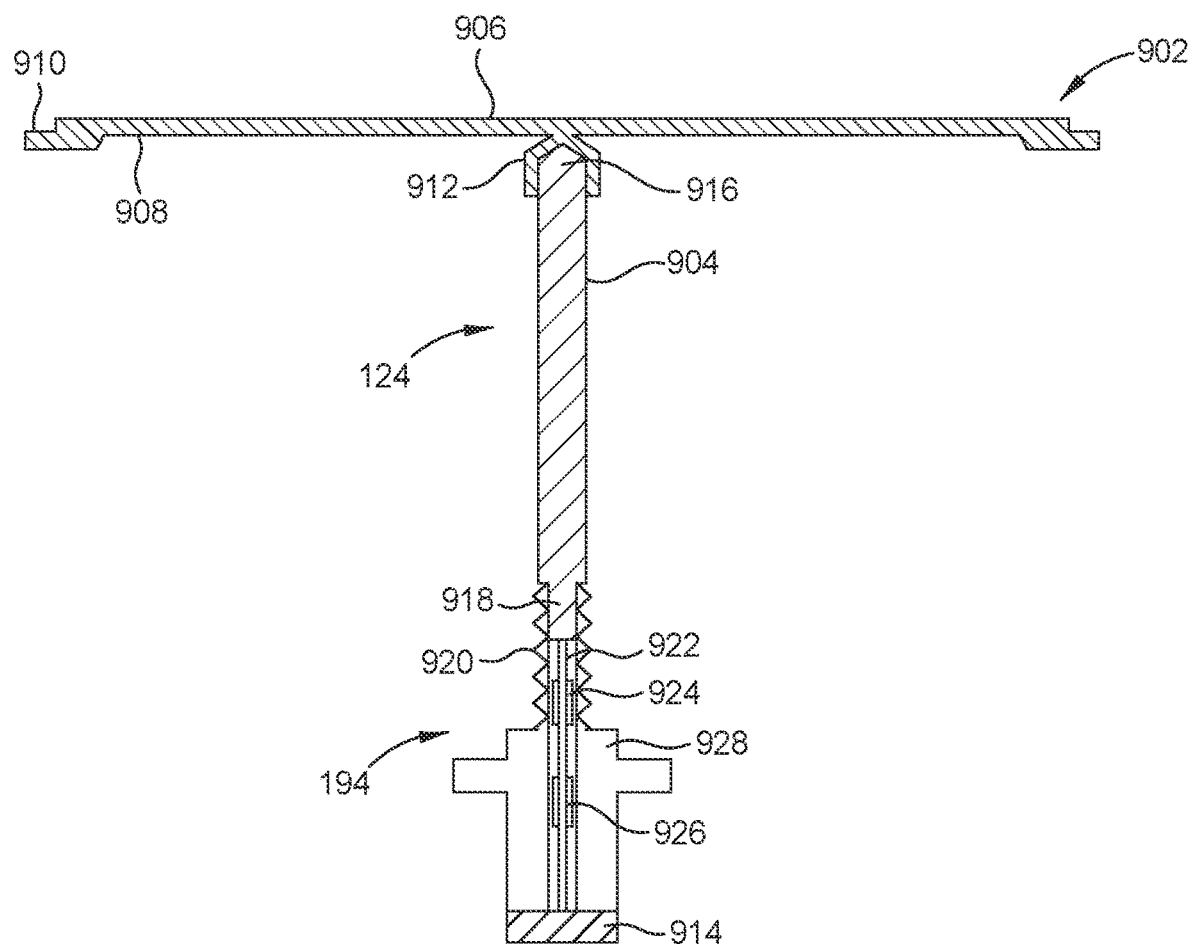
FIG. 9 is a schematic cross sectional view of a susceptor and a rotation assembly, according to embodiments of the present disclosure.

FIG. 9 is a schematic cross sectional view of a susceptor assembly 124. The susceptor assembly 124 includes a susceptor 902, a support shaft 904, and the movement assembly 194. The susceptor 902 is connected to a top distal end of the support shaft 904, while the movement assembly 194 is connected to a bottom distal end of the support shaft 904. The susceptor assembly 124 is configured to hold the substrate 150 during substrate processing within the process chamber 100 (FIG. 1). The susceptor assembly 124 is configured to support the substrate 150 while also rotating, raising, or lowering the substrate 150.

The susceptor 902 includes a substrate support surface 906, a bottom surface 908, an outer ledge 910 disposed radially outward of the substrate support surface 906, and a shaft coupling 912 disposed on the bottom surface 908. The susceptor 902 is formed of an optically transparent material in order to enable uniform heating of the substrate 150 by the lower lamp module 104. In some embodiments, the susceptor 902 is fabricated from quartz or glass.

The substrate support surface 906 is a planar surface configured to receive the substrate 150. The substrate support surface 906, in some embodiments, includes features thereon, such as grooves or divots, to assist in uniform heating of the substrate 150. The outer ledge 910 surrounds the outer edge of the substrate support surface 906. The outer ledge 910 surrounds the substrate support surface 906 and is vertically offset below the substrate support surface 906. The outer ledge 910 is configured to support a cover ring or a cover plate (not shown).

The bottom surface 908 of the susceptor 902 is disposed on the opposite side of the susceptor 902 from the substrate support surface 906. The shaft coupling 912 coupled to the bottom surface 908 and extends downward. The shaft coupling 912 receives a portion of the top distal end 916 of the support shaft 904. In one example, the susceptor 902 is fitted on top of the support shaft 904 using the shaft coupling 912 while in a cool or room-temperature environment. The material and size of the shaft coupling 912 enables the shaft coupling 912 to form a strong connection to the top of the support shaft 904 and secure the susceptor 902 to the shaft 904 at raised temperatures, such as temperatures used during substrate processing. The support shaft 904 is generally linear in form and extends between the susceptor 902 and the movement assembly 194. The support shaft 904 is sized to cast a generally small shadow on the bottom surface of the susceptor 902 during substrate processing, thus reducing temperature disparities. A bottom distal end 918 of the support shaft 904 is coupled to the movement assembly 194. As shown herein, the bottom distal end 918 of the support shaft 904 may be partially disposed within the movement assembly 194.

The movement assembly 194 includes a bearing feedthrough assembly 928. The bearing feedthrough assembly 928 is a ferrofluidic feedthrough assembly and functions as a ferrofluidic bearing. The bearing feedthrough assembly 928 includes a shaft 922 coupled to the support shaft 904. The shaft 922 is rotated within the bearing feedthrough assembly 928. The use of a ferrofluidic feedthrough assembly as the bearing feedthrough assembly 928 increases the duration of use of the bearing feedthrough assembly 928 and reduces friction compared to other types of bearing assemblies.

The bearing feedthrough assembly 928 is combined with a first linear spline 924 and a second linear spline 926. Both the first linear spline 924 and the second linear spline 926 are connected to the shaft 922. The first linear spline 924 and the second linear spline 926 are at least partially disposed within the bearing feedthrough assembly 928 and assist in controlling upward and downward motion of the susceptor 902 and the support shaft 904. The first linear spline 924 and the second linear spline 926 are linear ball splines, but may be other types of linear bearings.

The bottom of the bearing feedthrough assembly 928 and the shaft 922 are coupled to a motor 914. The motor 914 may be a direct drive or other suitable motor. The motor 914 is configured rotate or linearly displace the shaft 922. In some embodiments, the motor 914 is two separate motors and includes one rotary motor to rotate the shaft 922 upon its axis, and one linear motor to axially displace the shaft. In some embodiments, the motor 914 is representative of the rotation assembly 196 and the lift assembly 198 described in FIG. 1.

A bellows assembly 920 is coupled to both the support shaft 904 and the bearing feedthrough assembly 928. The bellows assembly 920 surrounds at least a portion of the shaft 922 and enables a seal to be maintained between the support shaft 904 and the bearing feedthrough assembly 928 while the support shaft 904 and the susceptor 902 are raised and lowered by the motor 914.

FIG. 10A is another schematic cross sectional view of the deposition chamber 100 of FIG. 1 illustrating a lift arm assembly 1000, according to embodiments of the present disclosure. The lift arm assembly 1000 is disposed through the lower chamber exhaust passage 164 and configured to raise or lower the substrate 150 from the susceptor 902 of the susceptor assembly 124. The lift arm assembly 1000 includes a plurality of lift pins 1012, 1014, 1016, which are configured to pass through the susceptor 902 and contact the substrate 150. The lift pins 1012, 1014, 1016 apply a force to the substrate 150 and lift the substrate 150 from the susceptor 902. When the substrate 150 is transferred to the susceptor 902, the substrate 150 is placed by a robot (not shown) on the lift pins 1012, 1014, 1016 which are in a raised position. The lift pins 1012, 1014, 1016 are lowered to transfer the substrate 150 from the lift pins 1012, 1014, 1016.

The lift arm assembly 1000 includes an actuator assembly 1004, an arm assembly 1002, and the lift pins 1012, 1014, 1016. Each of the lift pins 1012, 1014, 1016 is disposed on the arm assembly 1002. The arm assembly 1002 is disposed from the actuator assembly 1004, through the lower chamber exhaust passage 164, and into the process volume 110. The arm assembly 1002 is disposed below the susceptor 902 (FIG. 9) of the susceptor assembly 124.

An arm opening 1005 is disposed through the lower liner 154 and the lower heater 152 when the lift arm assembly 1000 is present. The arm opening 1005 is sized to allow the arm assembly 1002 of the lift arm assembly 1000 to pass therethrough. In embodiments described herein, the arm opening 1005 is disposed adjacent to the lower chamber exhaust passage 164 and includes the lower exhaust liner opening 714 (FIG. 7). In embodiments in which the arm assembly 1002 is disposed through a different opening at a different angle, the arm opening 1005 is moved to correspond to the location of the arm assembly 1002. In embodiments described herein, the arm assembly 1002 of the lift arm assembly 1000 is disposed through the lower chamber exhaust passage 164 to simplify the purge system of the process chamber 100. When the arm assembly 1002 is placed through a separate opening other than the lower chamber exhaust passage 164, the purge system of the process chamber 100 may be adjusted accordingly. Positioning the arm assembly 1002 through the lower chamber exhaust passage 164 is therefore beneficial in reducing the complexity of the purge system of the process chamber 100.

The actuator assembly 1004 includes an actuator 1006, an alignment sensor 1018, an arm rack 1008 configured to mesh with and contacting a portion of the actuator 1006, and a bellows assembly 1010 disposed around a portion of the arm rack 1008. The actuator assembly 1004 is disposed outside of the chamber body assembly 106 and the process volume 110. In some embodiments, the actuator assembly 1004 is coupled to an outer surface of the chamber body assembly 106.

FIG. 10B is a schematic plan view of the lift arm assembly 1000 of FIG. 10A. The arm assembly 1002 includes a first arm 1020, a second arm 1022, and a third arm 1024. The first arm 1020 is disposed between the second arm 1022 and the third arm 1024. The first arm 1020 is shorter than the second arm 1022 or the third arm 1024. The second arm 1022 and the third arm 1024 are the same length. Each of the first arm 1020, the second arm 1022, and the third arm 1024 are coupled to a base 1036. A distal end of the first arm 1020, furthest from the base 1036, includes the first lift pin 1012. A distal end of the second arm 1022 furthest from the base 1036 includes the second lift pin 1016. A distal end of the third arm 1024 furthest from the base 1036 includes the third lift pin 1014.

Each of the first lift pin 1012, the second lift pin 1016, and the third lift pin 1014 extend upward from the first arm 1020, the second arm 1022, and the third arm 1024 respectively. Each of the first lift pin 1012, the second lift pin 1016, and the third lift pin 1014 are a similar height and extend a similar distance from the first arm 1020, the second arm 1022, and the third arm 1024. Each of the first lift pin 1012, the second lift pin 1016, and the third lift pin 1014 are vertically oriented, i.e., parallel to the central axis A.

The base 1036 is disposed at the bottom of the actuator assembly 1004 and connects each of the first arm 1020, the second arm 1022, and the third arm 1024 to the actuator assembly 1004. Each of the first arm 1020, the second arm 1022, and the third arm 1024 extend from a surface 1038 of the base 1036, such that each of the first arm 1020, the second arm 1022, and the third arm 1024 are disposed in a similar direction. In some embodiments, the first arm 1020 is centered between both the second arm 1022 and the third arm 1024. Both of the second arm 1022 and the third arm 1024 extend at an angle $\theta_2$ to the direction at which the first arm 1020 extends. The angle $\theta_2$ defined between the first arm 1020 and the second arm 1022 is between about 5 degrees to about 45 degrees, such as about 10 degrees to about 35 degrees. The angle $\theta_2$ at which the second arm 1022 and the third arm 1024 extends with respect to the first arm 1020 is at least partially controlled by the width of the lower chamber exhaust passage 164 or another opening through which the arm assembly 1002 extends. In alternative embodiments, the base 1036 extends through the lower chamber exhaust passage 164 and the arms 1020, 1022, 1024 extend outward from the base 1036 inside of the process volume 110.

The arm rack 1008 is coupled to the arm assembly 1002 and extends above the arm assembly 1002. The arm rack 1008 coupled the arm assembly 1002 to the actuator 1006. The actuator 1006 is configured to raise and lower the arm assembly 1002 using the arm rack 1008. A bellows assembly 1010 surrounds at least a portion of the arm rack 1008 and seals the arm rack 1008 and the actuator 1006 from exhaust gases flown through the lower chamber exhaust passage 164 to protect the arm rack 1008 and the actuator 1006.

FIG. 10C is a schematic side view of the lift arm assembly 1000 of FIG. 10A. The lift arm assembly 1000 as shown in FIG. 10C is viewed through the section line 10C-10C of FIG. 10B. An alignment sensor 1018 and the actuator assembly 1004 are shown in FIG. 10C.

The alignment sensor 1018 is shown adjacent to the actuator assembly 1004 and coupled to the arm assembly 1002. The alignment sensor 1018 is configured to detect the location of one or more lift pin holes (not shown) disposed through the susceptor 902 (FIG. 9). The alignment sensor 1018 is coupled to one or more light pipes 1028. The light pipes 1028 extend through from the alignment sensor 1018 and through one of the arms 1020, 1022, 1024 of the arm assembly 1002. In embodiments shown herein, the light pipes 1028 extend through the first arm 1020 and into the first lift pin 1012. Alternatively, the light pipe 1028 extends through one of the second lift pin 1016 or the third lift pin 1014. The light pipe 1028 is directed upward and exposed at an end of the first lift pin 1012. The light pipe 1028 is utilized to detect the presence of a surface above the top of the first lift pin 1012. When a lift pin hole of the susceptor 902 is rotated above the lift pin 1012, the alignment sensor 1018 detects the change in light intensity. The alignment sensor 1018 therefore is used to detect when the arm assembly 1002 is aligned with the lift pin holes and the substrate 150. The rotation of the susceptor 902 is then stopped (if needed) so that the pins 1012, 1014, 1016 may be raised to extend through the susceptor 902 and facilitate substrate transfer to and from the susceptor 902.

The actuator assembly 1004 includes the actuator 1006, an arm rack 1008, and a bellows assembly 1010. The actuator 1006 includes a motor 1032 and a pinion 1026 coupled to the motor 1032. The pinion 1026 includes a first plurality of teeth and is configured to mesh with a second plurality of teeth 1036 of the arm rack 1008. The meshing of the arm rack 1008 and the pinion 1026 enables motor 1032 to impart linear movement onto the arm rack 1008 and the arm assembly 1002.

The bellows assembly 1010 is disposed around the lower portion of the arm rack 1008 and between a first plate 1030 and a second plate 1034. The first plate 1030 is disposed on top of the bellows assembly 1010 and is coupled to a body 1040 of the actuator 1006. The first plate 1030 is disposed around the arm rack 1008. The second plate 1034 is disposed on the bottom of the bellows assembly 1010 and is attached to the bottom of the arm rack 1008. The second plate 1034 is configured to connect the arm rack 1008 and the arm assembly 1002. In embodiments described herein, the second plate 1034 is connected to the base 1036 of the arm assembly 1002. The bellows assembly 1010 is configured to seal the arm rack 1008 and the actuator 1006 from exhaust gases while allowing vertical movement.

Other embodiments of the arm assembly 1002 are also contemplated. In some embodiments, a Y-shaped arm is utilized. In yet other embodiments, there are more than three arms or less than three arms. Each of the first arm 1020, the second arm 1022, and the third arm 1024 may be different lengths in alternative embodiments. Embodiments described herein use a second arm 1022 and a third arm 1024 mirrored around the first arm 1020 to balance the arm assembly 1002 and reduce unwanted torque on the actuator 1006 or bearing components.

The components described herein allow greater uniformity and deposition control within a process chamber, such as the process chamber 100. Although illustrated together in one process chamber 100 herein, components described herein may be utilized separately with existing or alternative deposition process chambers.

While the foregoing is directed to embodiments of the present disclosure, other and further embodiments of the disclosure may be devised without departing from the basic scope thereof, and the scope thereof is determined by the claims that follow.

What is claimed is:

1. A process chamber for substrate processing comprising:
   an upper lamp module;
   a lower lamp module;
   a substrate support disposed between the upper lamp module and the lower lamp module;
   an upper window disposed between the upper lamp module and the substrate support;
   a lower window disposed between the lower lamp module and the substrate support;
   a chamber body assembly disposed between the upper lamp module and the lower lamp module and forming a portion of a process volume, the chamber body assembly comprising:
      a base ring, comprising:
         a substrate transfer passage disposed through the base ring;
         a lower chamber exhaust passage disposed opposite the substrate transfer passage and through the base ring; and
         one or more upper chamber exhaust passages, each of the one or more upper chamber exhaust passages having an upper chamber exhaust passage opening disposed above the lower chamber exhaust passage through a top surface of the base ring; and
      an inject ring disposed on top of the base ring, comprising:
         one or more injector passages disposed through the inject ring and above the substrate transfer passage; and
         one or more indents formed between an inner inject ring surface and a bottom inject ring surface, the one or more indents disposed above and aligned with the one or more upper chamber exhaust passage openings.

2. The process chamber of claim 1, further comprising one or more gas injectors disposed within the one or more injector passages, one or more gas outlets of each of the one or more gas injectors disposed at an angle greater than about 5 degrees from a horizontal.

3. The process chamber of claim 1, wherein the one or more upper chamber exhaust passage openings are fluidly coupled to the one or more upper chamber exhaust passages.

4. The process chamber of claim 3, wherein the one or more upper chamber exhaust passages includes two upper chamber exhaust passages.

5. The process chamber of claim 4, wherein the two upper chamber exhaust passages are disposed on opposite sides of the lower chamber exhaust passage.

6. The process chamber of claim 5, further comprising:
   an upper liner disposed inside of and adjacent to the inject ring; and
   a lower liner disposed inside of and adjacent to the base ring.

7. The process chamber of claim 6, wherein a lower heater is disposed between the lower liner and an inner surface of the base ring.

8. The process chamber of claim 3, further comprising:
   an upper cooling ring separate from and disposed above the inject ring and comprising a first coolant passage disposed therethrough; and
   a lower cooling ring separate from and disposed below the base ring and comprising a second coolant passage disposed therethrough.

9. A process chamber for substrate processing comprising:
   an upper lamp module comprising:
      an upper module body comprising a top surface and a bottom surface; and
      a plurality of lamp apertures disposed from the bottom surface to the top surface;
   a lower lamp module;
   a substrate support disposed between the upper lamp module and the lower lamp module;
   an upper window disposed between the upper lamp module and the substrate support;
   a lower window disposed between the lower lamp module and the substrate support;
   a chamber body assembly disposed between the upper lamp module and the lower lamp module and forming a portion of a process volume, the chamber body assembly comprising:
      a base ring, comprising:
         a substrate transfer passage disposed through the base ring;
         a lower chamber exhaust passage disposed opposite the substrate transfer passage and through the base ring; and
         one or more upper chamber exhaust passages disposed through the base ring, each of the one or more upper chamber exhaust passages having an upper chamber exhaust passage opening; and an inject ring, comprising:
one or more injector passages disposed through the chamber body assembly; and
one or more indents formed between an inner inject ring surface and a bottom inject ring surface, the one or more indents disposed above and aligned with the one or more upper chamber exhaust passage openings.

10. The process chamber of claim 9, wherein the lower lamp module comprises a lift arm assembly comprising:
an arm assembly disposed through the lower chamber exhaust passage;
a plurality of lift pins coupled to the lift arm assembly; and
an alignment sensor.

11. The process chamber of claim 10, wherein the substrate support further comprises a ferromagnetic bearing configured to enable rotating of the substrate support about an axis.

12. The process chamber of claim 9, wherein the upper lamp module further comprises a plurality of bulb openings disposed through the top surface and wherein the plurality of lamp apertures have an inner wall extending between the top surface and the bottom surface, the inner wall having a circular or elliptical cross section at the bottom surface of the upper lamp module and formed of a reflective material with a reflectance of greater than about 90% for a wavelength between about 700 nm to about 15000 nm.

13. The process chamber of claim 9, wherein the upper chamber exhaust passage opening is disposed around a portion of the circumference of the chamber body assembly, each upper chamber exhaust passage extending around about 25 degrees to about 60 degrees of the chamber body assembly.

14. The process chamber of claim 9, wherein the plurality of lamp apertures are disposed in three distinct zones, each zone comprising 5 to 10 lamp apertures.

15. The process chamber of claim 9, wherein a groove is disposed around a majority of the circumference of the inner inject ring surface and each of the indents are within the groove and extend deeper into a body of the inject ring than the groove.

16. The process chamber of claim 15, wherein the one or more upper chamber exhaust passages include two upper chamber exhaust passages on opposite sides of the lower chamber exhaust passage.

17. A process chamber for substrate processing comprising:
an upper lamp module comprising:
an upper module body comprising a top surface and a bottom surface; and
a plurality of lamp apertures disposed from the bottom surface towards the top surface;
a lower lamp module;
a substrate support disposed between the upper lamp module and the lower lamp module;
an upper window disposed between the upper lamp module and the substrate support;
a lower window disposed between the lower lamp module and the substrate support;
a chamber body assembly disposed between the upper lamp module and the lower lamp module and forming a portion of a process volume, the chamber body assembly comprising:
a base ring, comprising:
a substrate transfer passage disposed through the base ring;
one or more upper chamber exhaust passages disposed through the base ring, each of the one or more upper chamber exhaust passages having an upper chamber exhaust passage opening in fluid communication with the process volume; and
a lower chamber exhaust passage disposed through the base ring and below the upper chamber exhaust passages openings; and
an inject ring disposed on the base ring, comprising:
one or more injector support surfaces disposed along an outer inject ring surface;
one or more injector passages disposed above the substrate transfer passage and from the one or more injector support surfaces to an inner inject ring surface;
a groove is disposed around a majority of the circumference of the inner inject ring surface; and
one or more indents formed within the groove, the one or more indents disposed above and aligned with the one or more upper chamber exhaust passage openings and extending further into the inject ring than the groove.

18. The process chamber of claim 17, wherein a lift arm assembly is disposed through the lower chamber exhaust passage and includes a plurality of arms disposed within the process volume.

19. The process chamber of claim 18, wherein the lift arm assembly further comprises a lift pin extending upward from each arm of the plurality of arms and an alignment sensor coupled to one of the lift pins and configured to detect a lift pin hole within the substrate support.

20. The process chamber of claim 17, further comprising:
an upper cooling ring separate from and disposed above the inject ring and comprising a first coolant passage disposed therethrough;
a lower cooling ring separate from and disposed below the base ring and comprising a second coolant passage disposed therethrough;
an upper heater disposed within the groove; and
a lower heater disposed radially inward of an inner base ring surface and below the upper heater.

* * * * *